US012757409B2

(12) United States Patent
Lee

(10) Patent No.: US 12,757,409 B2
(45) Date of Patent: Oct. 6, 2026

(54) SEMICONDUCTOR DEVICE

(71) Applicant: SAMSUNG ELECTRONICS CO., LTD., Suwon-si (KR)

(72) Inventor: Kilho Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 480 days.

(21) Appl. No.: 18/400,741

(22) Filed: Dec. 29, 2023

(65) Prior Publication Data

US 2024/0389352 A1 Nov. 21, 2024

(30) Foreign Application Priority Data

May 16, 2023 (KR) ........................ 10-2023-0063190

(51) Int. Cl.
*H10B 61/00* (2023.01)

(52) U.S. Cl.
CPC .................................... *H10B 61/00* (2023.02)

(58) Field of Classification Search
CPC ........ H10B 61/00; H10B 63/24; H10B 63/80; H10B 61/22; H10B 61/10; H10N 70/063; H10N 70/231; H10N 70/826; H10N 50/10; H10N 50/80
See application file for complete search history.

(56) References Cited

U.S. PATENT DOCUMENTS

| | | | | |
|---|---|---|---|---|
| 9,543,357 | B2 | 1/2017 | Ko et al. | |
| 10,164,170 | B2 * | 12/2018 | Suh | H10B 61/00 |
| 10,504,902 | B2 | 12/2019 | Kim et al. | |
| 10,535,817 | B1 | 1/2020 | Hung et al. | |
| 11,152,426 | B2 | 10/2021 | Hsiao et al. | |
| 11,437,432 | B2 | 9/2022 | Lee et al. | |
| 11,462,415 | B2 | 10/2022 | Zhou | |
| 2016/0020249 | A1 * | 1/2016 | Ko | H10B 61/00 257/427 |
| 2017/0110508 | A1 * | 4/2017 | Kim | H10B 61/22 |
| 2022/0045266 | A1 * | 2/2022 | Lin | H10B 61/00 |
| 2022/0254990 | A1 | 8/2022 | Ryu et al. | |
| 2022/0302207 | A1 | 9/2022 | Mignot et al. | |

* cited by examiner

*Primary Examiner* — Jonathan Han
(74) *Attorney, Agent, or Firm* — Fish & Richardson P.C.

(57) ABSTRACT

A semiconductor device includes a substrate including a cell region and a peripheral region, a wiring structure on the cell and peripheral regions, a lower insulating layer on the wiring structure on the cell and peripheral regions, data storage patterns on the lower insulating layer on the cell region, a cell insulating layer on the lower insulating layer on the cell region and covering the data storage patterns, including cell extending portions extending above the lower insulating layer on the peripheral region in a first direction, the cell extending portions spaced apart from each other in a second direction, and a peripheral insulating layer on the lower insulating layer on the peripheral region and including a material different from that of the cell insulating layer. The peripheral insulating layer extends between the cell extending portions and is in contact with a side surface of the cell insulating layer.

20 Claims, 24 Drawing Sheets

SEMICONDUCTOR DEVICE

CROSS-REFERENCE TO RELATED APPLICATIONS

This U.S. non-provisional patent application claims priority under 35 U.S.C. § 119 to Korean Patent Application No. 10-2023-0063190, filed on May 16, 2023, in the Korean Intellectual Property Office, the entire contents of which are hereby incorporated by reference.

BACKGROUND

With the high speed and/or low power consumption of electronic devices, there is an increasing requirement for high speed and/or low operating voltage of semiconductor devices incorporated in an electronic device. To meet the requirement, magnetic memory devices have been proposed as semiconductor memory devices. Because magnetic memory devices may exhibit characteristics such as high-speed operation and/or non-volatility, they are being spotlighted as the next-generation semiconductor devices.

In general, a magnetic memory device may include a magnetic tunnel junction (MTJ) pattern. The MTJ pattern may include two magnetic substances and an insulating layer interposed therebetween. Resistance of the MTJ pattern may vary depending on magnetization directions of the two magnetic substances. For example, when the magnetization directions of the two magnetic substances are anti-parallel to each other, the MTJ pattern may have low resistance. Data may be written/read using the resistance difference.

As the electronic industry is highly developed, various studies are conducted on a semiconductor device having an embedded structure in which a magnetic tunnel junction pattern is disposed between metal wirings.

SUMMARY

The present disclosure relates to a semiconductor device and a method of manufacturing the same, and more particularly, relates to a semiconductor device including a magnetic tunnel junction and a method of manufacturing the same.

Some implementations of the present disclosure provide a semiconductor device capable of minimizing defects in a manufacturing process and a method of manufacturing the same.

Some implementations of the present disclosure provide a semiconductor device that is easy to manufacture and a manufacturing method thereof.

A semiconductor device according to some implementations of the present disclosure may include a substrate including a cell region and a peripheral region, a wiring structure disposed on the cell region and the peripheral region, a lower insulating layer disposed on the wiring structure on the cell region and extending onto the wiring structure on the peripheral region, data storage patterns disposed on the lower insulating layer on the cell region, a cell insulating layer disposed on the lower insulating layer on the cell region and covering the data storage patterns, including cell extending portions extending onto the lower insulating layer on the peripheral region in a first direction parallel to an upper surface of the substrate, the cell extending portions spaced apart from each other in a second direction that is parallel to the upper surface of the substrate and intersects the first direction, and a peripheral insulating layer disposed on the lower insulating layer on the peripheral region and including a material different from that of the cell insulating layer, and the peripheral insulating layer may extend between the cell extending portions and is in contact with a side surface of the cell insulating layer.

A semiconductor device according to some implementations of the present disclosure may include a substrate including a cell region and a peripheral region, a wiring structure disposed on the cell region and the peripheral region, including a reference conductive line extending in a first direction parallel to an upper surface of the substrate on the cell region, the reference conductive line extending onto the peripheral region in the first direction, a lower insulating layer disposed on the wiring structure on the cell region and extending onto the wiring structure on the peripheral region, data storage patterns disposed on the lower insulating layer on the cell region, a cell insulating layer disposed on the lower insulating layer on the cell region and covering the data storage patterns, including a cell extending portion protruding onto the lower insulating layer on the peripheral region in the first direction, the cell extending portion vertically overlapping the reference conductive line on the peripheral region in a direction perpendicular to the upper surface of the substrate, and a peripheral insulating layer disposed on the lower insulating layer on the peripheral region and including a material different from that of the cell insulating layer, and the peripheral insulating layer may be in contact with a side surface of the cell extending portion.

BRIEF DESCRIPTION OF THE DRAWINGS

Example implementations will be more clearly understood from the following brief description taken in conjunction with the accompanying drawings. The accompanying drawings represent non-limiting, example implementations as described herein.

DETAILED DESCRIPTION

Hereinafter, the present disclosure will be described in detail by describing implementations of the present disclosure with reference to the accompanying drawings.

Figure 1:
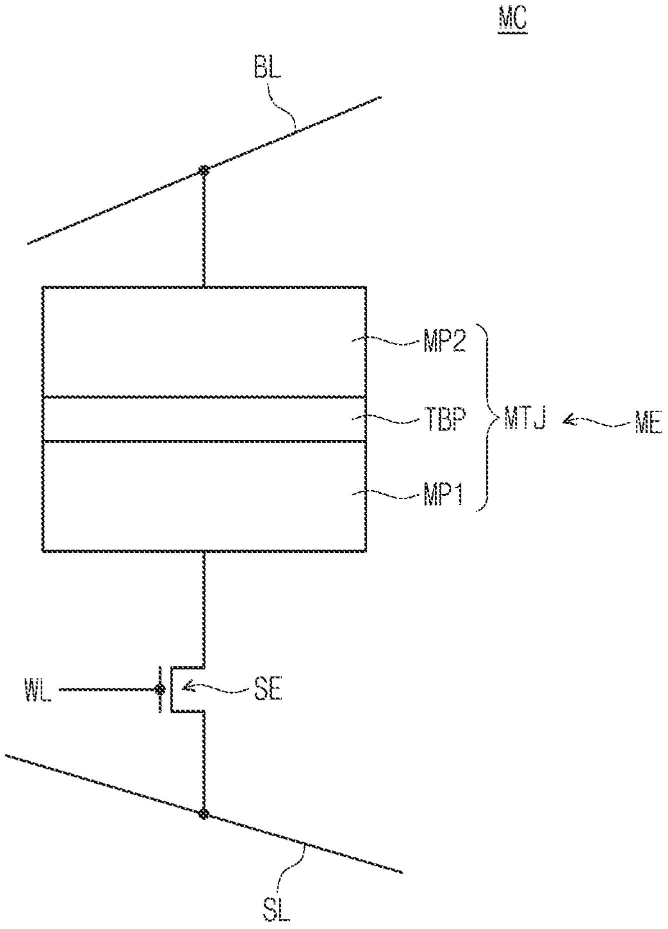
FIG. 1 is a circuit diagram illustrating a unit memory cell of a semiconductor device according to some implementations of the present disclosure.

FIG. 1 is a circuit diagram illustrating a unit memory cell of a semiconductor device according to some implementations of the present disclosure.

Referring to FIG. 1, a unit memory cell MC includes a memory element ME and a selection element SE. The memory element ME and the selection element SE may be electrically connected to each other in series. The memory element ME may be connected between a bit line BL and the selection element SE. The selection element SE may be connected between the memory element ME and a source line SL and may be controlled by a word line WL. The selection element SE may include, for example, a bipolar transistor or a MOS field effect transistor.

The memory element ME may include a magnetic tunnel junction pattern MTJ including magnetic patterns MP1 and MP2 spaced apart from each other and a tunnel barrier pattern TBP between the magnetic patterns MP1 and MP2. One of the magnetic patterns MP1 and MP2 may be a reference magnetic pattern having a magnetization direction fixed in one direction regardless of an external magnetic field under a normal use environment. The other of the magnetic patterns MP1 and MP2 may be a free magnetic pattern in which a magnetization direction is changed between two stable magnetization directions by an external magnetic field. An electrical resistance of the magnetic tunnel junction pattern MTJ may be much higher when magnetization directions of the reference magnetic pattern and the free magnetic pattern are antiparallel to each other than when magnetization directions are parallel to each other. That is, the electrical resistance of the magnetic tunnel junction pattern MTJ may be adjusted by changing the magnetization direction of the free magnetic pattern. Accordingly, the memory element ME may store data in the unit memory cell MC using a difference in electrical resistance depending on magnetization directions of the reference magnetic pattern and the free magnetic pattern.

Figure 2:
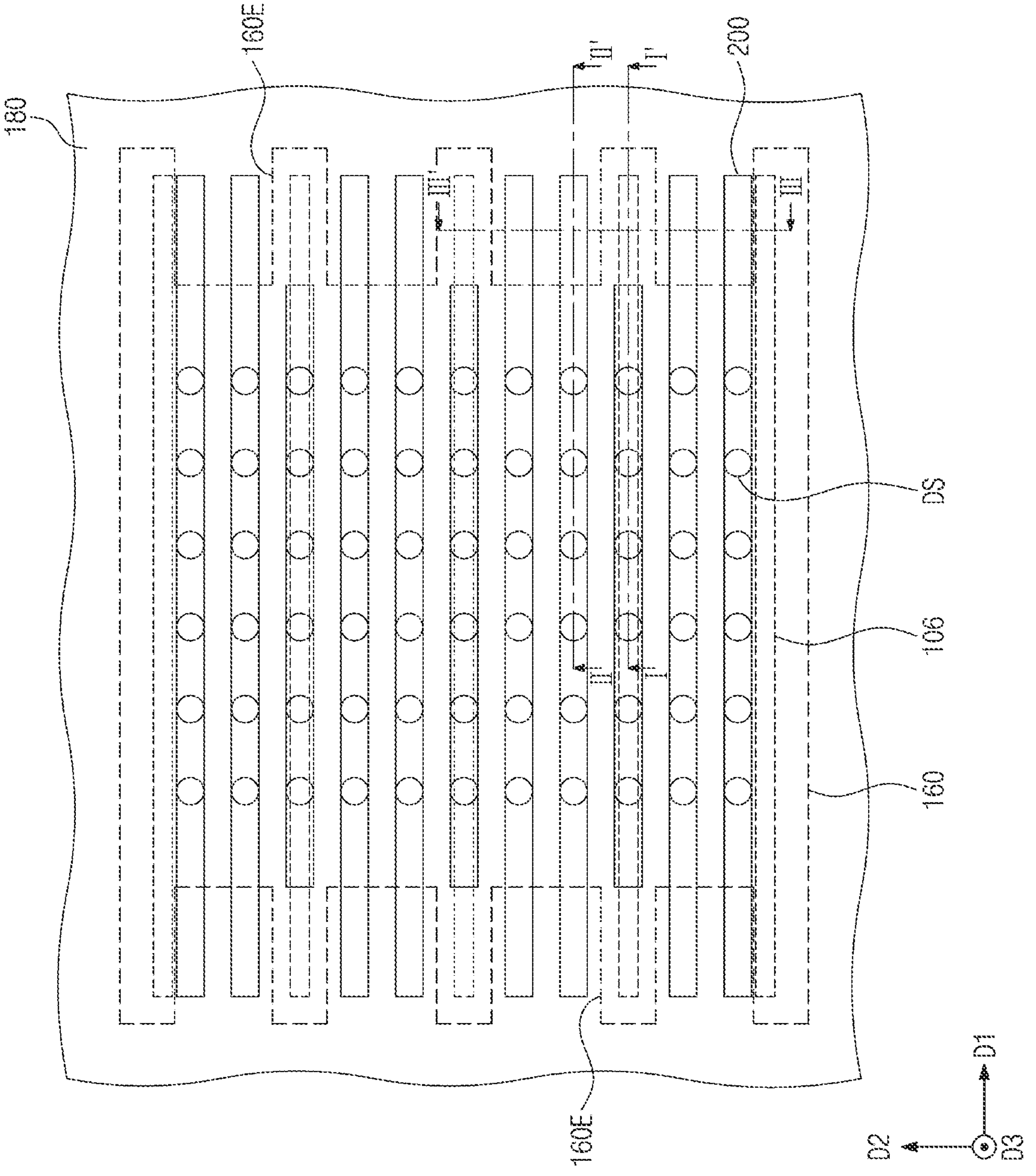
FIG. 2 is a plan view of a semiconductor device according to some implementations of the present disclosure.
Figure 3A:
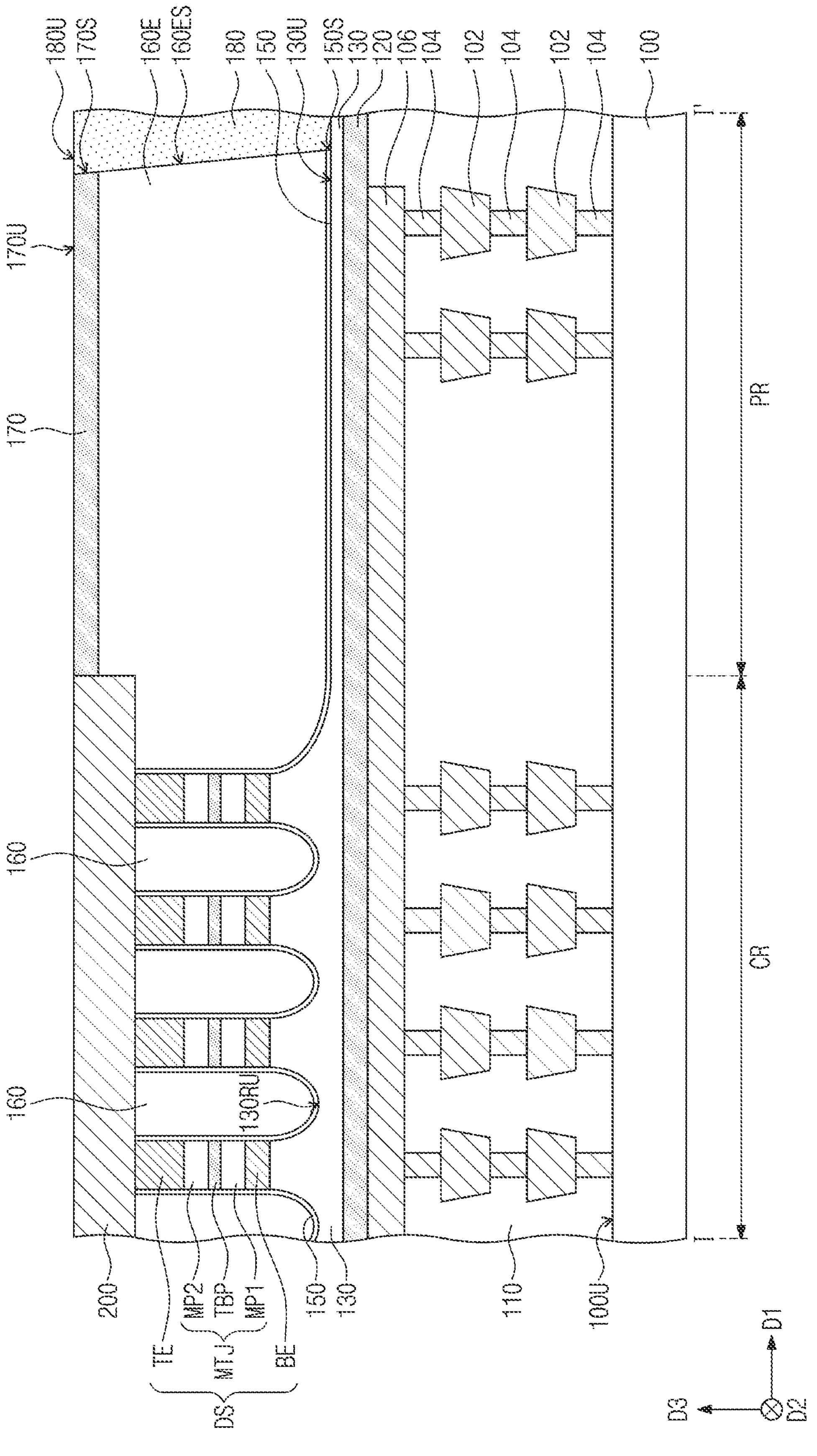
FIGS. 3A, 3B and 3C are cross-sectional views taken along lines I-I', II-II' and III-III' of FIG. 2, respectively.
Figure 3B:
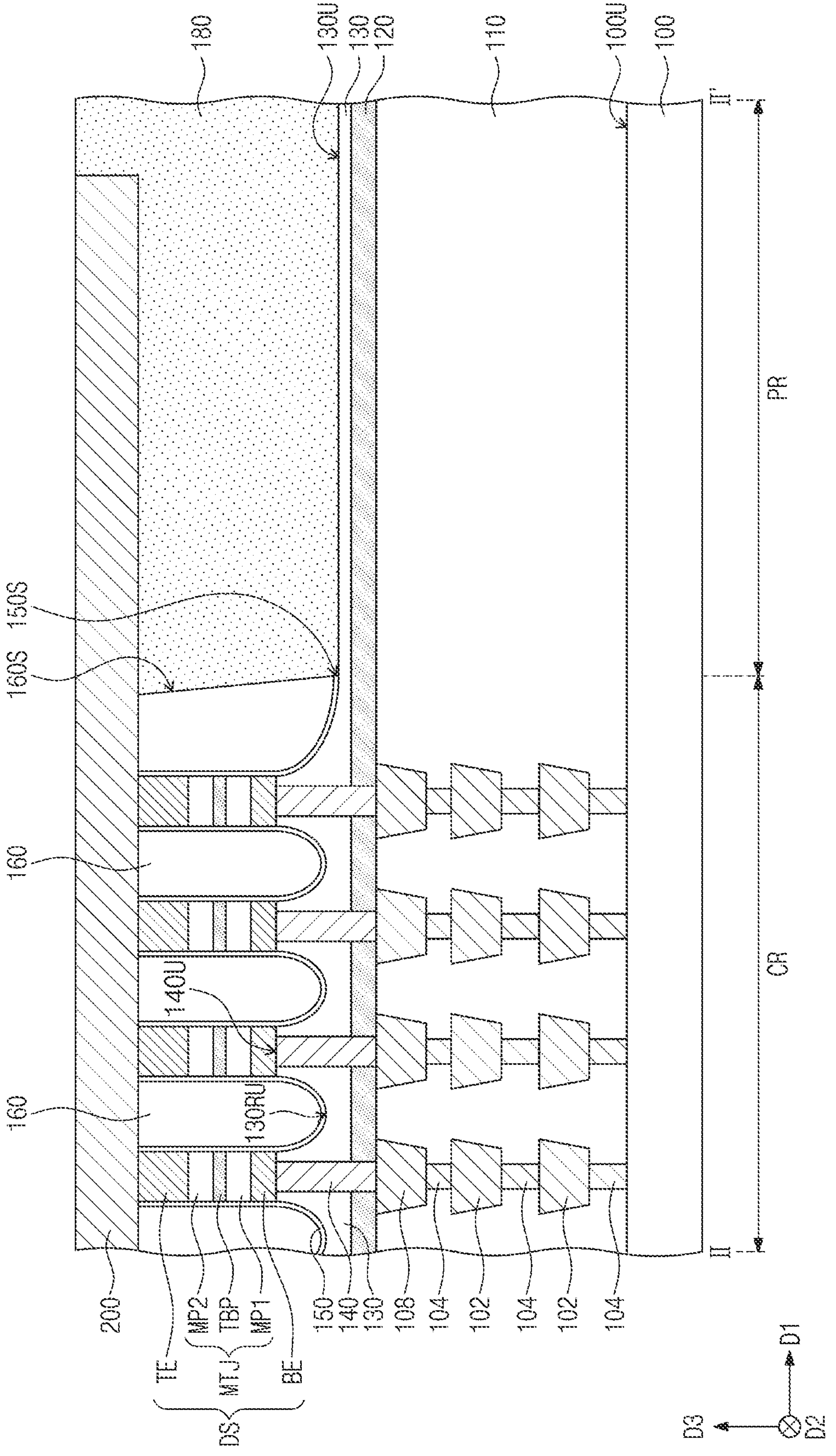
Figure 3C:
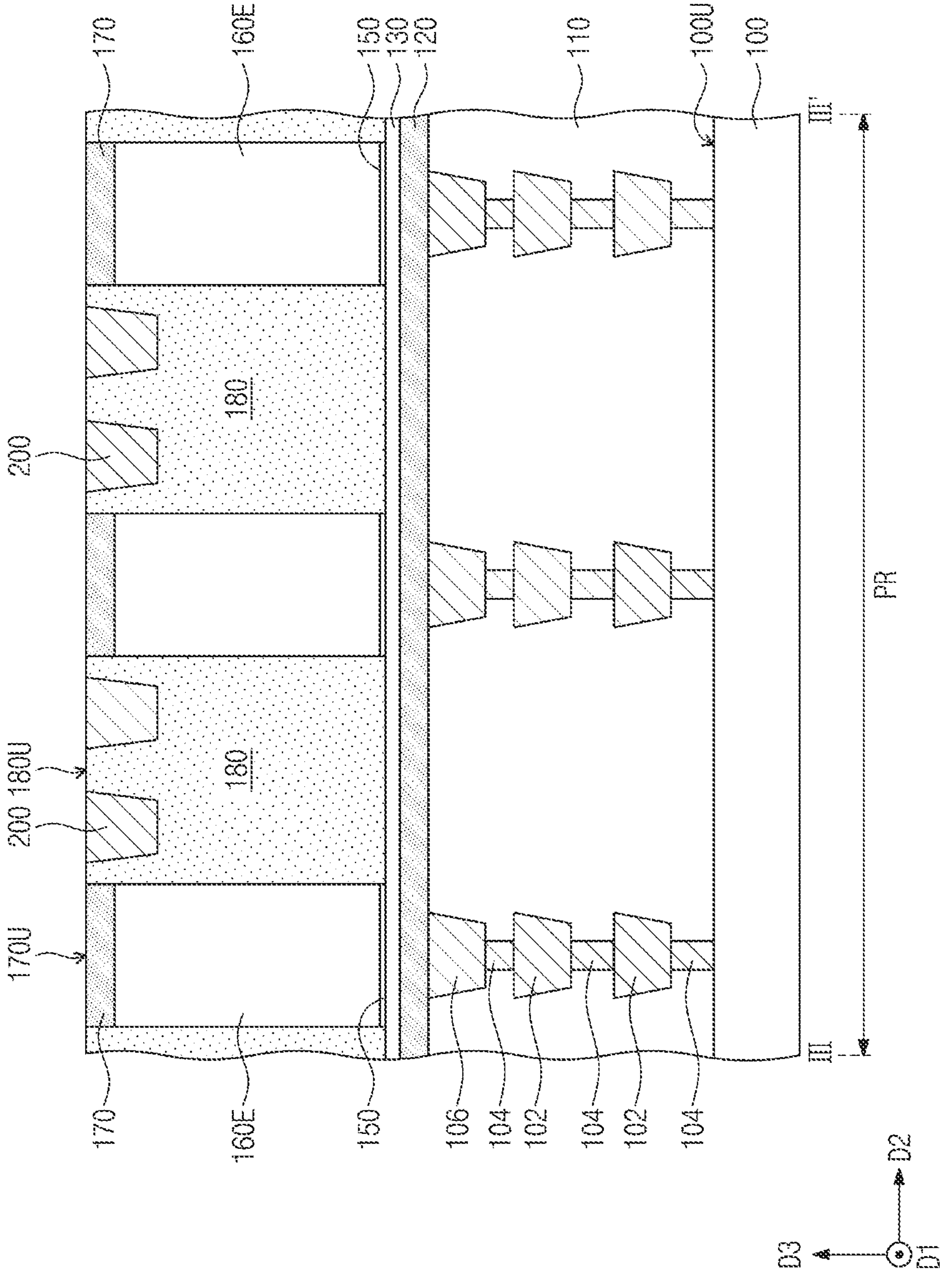
Figure 4A:
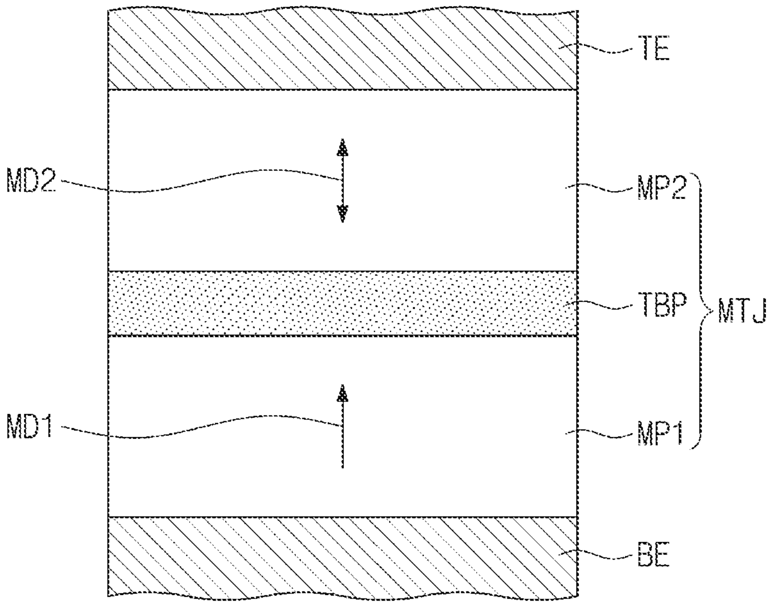
FIGS. 4A and 4B are cross-sectional views respectively illustrating examples of magnetic tunnel junction patterns of semiconductor devices according to some implementations of the present disclosure.
Figure 4B:
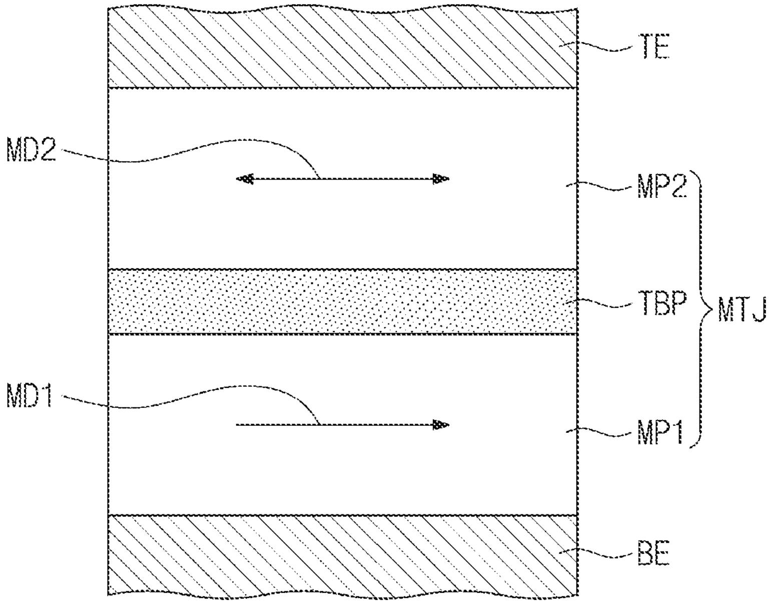

FIG. 2 is a plan view of a semiconductor device according to some implementations of the present disclosure. FIGS. 3A, 3B and 3C are cross-sectional views taken along lines I-I', II-II' and III-III' of FIG. 2, respectively. FIGS. 4A and 4B are cross-sectional views respectively illustrating examples of magnetic tunnel junction patterns of semiconductor devices according to some implementations of the present disclosure.

Referring to FIGS. 2 and 3A to 3C, a substrate 100 including a cell region CR and a peripheral region PR is provided. The substrate 100 may be a semiconductor substrate including silicon (Si), silicon on insulator (SOI), silicon germanium (SiGe), germanium (Ge), gallium arsenide (GaAs), or the like. The cell region CR may be a region of the substrate 100 in which the memory cells MC of FIG. 1 are provided, and the peripheral region PR may be another region of the substrate 100 provided with peripheral circuits for driving the memory cells MC.

Wiring structures 102, 104, 106, and 108 are disposed on the substrate 100. The wiring structures 102, 104, 106, and 108 may be disposed on the cell region CR and the peripheral region PR of the substrate 100. The wiring structures 102, 104, 106, and 108 may include reference conductive lines 106 extending in a first direction D1 and spaced apart from each other in a second direction D2, on the cell region CR. The first direction D1 and the second direction D2 may be parallel to an upper surface 100U of the substrate 100 and may cross each other. The reference conductive lines 106 may extend onto the peripheral region PR in the first direction D1. The wiring structures 102, 104, 106, and 108 may further include lower conductive lines 108 disposed on the cell region CR. The lower conductive lines 108 may be positioned at the same height as the reference conductive lines 106 from the substrate 100. Herein, a height is a distance measured from the upper surface 100U of the substrate 100 in a third direction D3 perpendicular to the upper surface 100U of the substrate 100.

The wiring structures 102, 104, 106, and 108 may further include wiring lines 102 disposed between the substrate 100 and the reference conductive lines 106 and between the substrate 100 and the lower conductive lines 108, and wiring contacts 104 connected to the wiring lines 102. Each of the reference conductive lines 106 and the lower conductive lines 108 may be electrically connected to a corresponding wiring line 102 among the wiring lines 102 through a corresponding wiring contact 104 among the wiring contacts 104. The reference conductive lines 106, the lower conductive lines 108, the wiring lines 102, and the wiring contacts 104 may include metal (e.g., copper).

Selection elements (SE in FIG. 1) may be disposed on the substrate 100. The selection elements may be, for example, field effect transistors. Each of the lower conductive lines 108 may be electrically connected to a terminal (e.g., a drain terminal) of a corresponding one of the selection elements through a corresponding wiring contact 104 and a corresponding wiring line 102. Reference cells may be disposed on the substrate 100. Each of the reference cells may include, for example, a polysilicon resistive layer. Each of the reference conductive lines 106 may be electrically connected to one terminal of a corresponding one of the reference cells through a corresponding wiring contact 104 and a corresponding wiring line 102, and may detect a reference resistance. Resistance states (e.g., high resistance or low resistance) of magnetic tunnel junction patterns to be described later may be detected using the reference resistance sensed by the reference conductive lines 106.

A wiring insulating layer 110 may be disposed on the substrate 100 to cover the wiring structures 102, 104, 106, and 108. The wiring insulating layer 110 may be disposed on the cell region CR of the substrate 100 and may extend onto the peripheral region PR. The wiring insulating layer 110 may expose upper surfaces of the reference conductive lines 106 and the lower conductive lines 108. For example, an upper surface of the wiring insulating layer 110 may be substantially coplanar with the exposed upper surfaces of the reference conductive lines 106 and the lower conductive lines 108. The wiring insulating layer 110 may include, for example, silicon oxide, silicon nitride, and/or silicon oxynitride.

A first lower insulating layer 120 may be disposed on the wiring insulating layer 110 and may cover the exposed upper surfaces of the reference conductive lines 106 and the lower conductive lines 108. The first lower insulating layer 120 may be disposed on the wiring insulating layer 110 on the cell region CR and may extend onto the wiring insulating layer 110 on the peripheral region PR. The first lower insulating layer 120 may include, for example, silicon oxide, silicon nitride, and/or silicon oxynitride.

A second lower insulating layer 130 may be disposed on the first lower insulating layer 120. The second lower insulating layer 130 may be disposed on the first lower insulating layer 120 on the cell region CR and extend onto the first lower insulating layer 120 on the peripheral region PR. The first lower insulating layer 120 may be interposed between the wiring insulating layer 110 and the second lower insulating layer 130 on the cell region CR and the peripheral region PR. The second lower insulating layer 130 may include, for example, silicon oxide, silicon nitride, and/or silicon oxynitride. The first lower insulating layer 120 and the second lower insulating layer 130 may be referred to as a lower insulating layer.

Data storage patterns DS may be disposed on the second lower insulating layer 130 on the cell region CR. The data storage patterns DS may be spaced apart from each other in the first direction D1 and the second direction D2. The second lower insulating layer 130 on the cell region CR may have a recessed upper surface 130RU that is recessed toward the substrate 100 between the data storage patterns DS. An upper surface 130U of the second lower insulating layer 130 on the peripheral region PR may be positioned at a height lower than the recessed upper surface 130RU of the second lower insulating layer 130 on the cell region CR.

Lower electrode contacts 140 may be disposed in the second lower insulating layer 130 on the cell region CR, and may be spaced apart from each other in the first direction D1 and the second direction D2. The lower electrode contacts 140 may be respectively disposed below corresponding data storage patterns DS among the data storage patterns DS, and may be electrically connected to the corresponding data storage patterns DS, respectively. The data storage patterns DS may include dummy data storage patterns DS which are not connected to the lower electrode contacts 140. Each of the lower electrode contacts 140 may pass through the first and second lower insulating layers 120 and 130 on the cell region CR, and may be connected to a corresponding one of the lower conductive lines 108. Upper surfaces 140U of the lower electrode contacts 140 may be positioned at a height higher than the recessed upper surface 130RU of the second lower insulating layer 130 on the cell region CR. The lower electrode contacts 140 may include a doped semiconductor material (e.g., doped silicon), a metal (e.g., tungsten, titanium, and/or tantalum), a metal-semiconductor compound (e.g., metal silicide), and a conductive metal nitride. (e.g., titanium nitride, tantalum nitride, and/or tungsten nitride).

The lower conductive lines 108 may be electrically connected to the corresponding data storage patterns DS through the lower electrode contacts 140. The reference conductive lines 106 may be electrically separated from the data storage patterns DS by the first and second lower insulating layers 120 and 130.

Each of the data storage patterns DS may include a lower electrode BE, a magnetic tunnel junction pattern MTJ, and an upper electrode TE sequentially stacked on the second lower insulating layer 130 in the third direction D3. The magnetic tunnel junction pattern MTJ may be disposed between the lower electrode BE and the upper electrode TE. Each of the lower electrode contacts 140 may be connected to each of the lower electrodes BE of the corresponding data storage patterns DS. The magnetic tunnel junction pattern MTJ may include a first magnetic pattern MP1, a second magnetic pattern MP2, and a tunnel barrier pattern TBP therebetween. The first magnetic pattern MP1 may be disposed between the lower electrode BE and the tunnel barrier pattern TBP, and the second magnetic pattern MP2 may be disposed between the upper electrode TE and the tunnel barrier pattern TBP. The lower electrode BE may include, for example, a conductive metal nitride (e.g., titanium nitride or tantalum nitride). The upper electrode TE may include at least one of a metal (e.g., Ta, W, Ru, Ir, etc.) and a conductive metal nitride (e.g., TiN).

Referring to FIGS. 4A and 4B, the first magnetic pattern MP1 may be a reference layer having a magnetization direction MD1 pinned in one direction, and the second magnetic pattern MP2 may be a free layer having a magnetization direction MD2 changeable to be parallel or anti-parallel to the magnetization direction MD1 of the first magnetic pattern MP1. Although the example illustrated in FIGS. 4A and 4B show the first magnetic pattern MP1 as a reference layer and the second magnetic pattern MP2 as a free layer, the implementations are not limited thereto. In some implementations, the first magnetic pattern MP1 may be a free layer and the second magnetic pattern MP2 may be a reference layer.

Referring to FIG. 4A, for example, the magnetization directions MD1 and MD2 of the first magnetic pattern MP1 and the second magnetic pattern MP2 may be perpendicular to an interface between the tunnel barrier pattern TBP and the second magnetic pattern MP2. In this case, each of the first magnetic pattern MP1 and the second magnetic pattern MP2 may include at least one of an intrinsic perpendicular magnetic substance and an extrinsic perpendicular magnetic substance. The intrinsic perpendicular magnetic substance may include a material having perpendicular magnetization characteristics even when there is no external factor. The intrinsic perpendicular magnetic substance may include at least one of i) perpendicular magnetic substance (e.g., CoFeTb, CoFeGd, CoFeDy), ii) perpendicular magnetic substance having an L10 structure, iii) CoPt having a hexagonal close packed lattice structure, and iv) vertical magnetic structures. The perpendicular magnetic substance having the L10 structure may include at least one of FePt of L10 structure, FePd of L10 structure, CoPd of L10 structure, or CoPt of L10 structure. The perpendicular magnetic structure may include magnetic layers and non-magnetic layers that are alternately and repeatedly stacked. For example, the perpendicular magnetic structure may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n ("n" is the number of stacking). The extrinsic perpendicular magnetic substance may include a material having intrinsic horizontal magnetization characteristics and perpendicular magnetization characteristics due to an external factor. For example, the extrinsic perpendicular magnetic substance may have the perpendicular magnetization characteristics due to magnetic anisotropy induced by making a junction of the first magnetic pattern MP1 (or the second magnetic pattern MP2) and the tunnel barrier pattern TBP. The extrinsic perpendicular magnetic substance may include, for example, CoFeB.

Referring to FIG. 4B, as another example, the magnetization directions MD1 and MD2 of the first magnetic pattern MP1 and the second magnetic pattern MP2 may be parallel to the interface between the tunnel barrier pattern TBP and the second magnetic pattern MP2. In this case, each of the first magnetic pattern MP1 and the second magnetic pattern MP2 may include a ferromagnetic substance. The first magnetic pattern MP1 may further include an antiferromagnetic substance for fixing a magnetization direction of the ferromagnetic substance in the first magnetic pattern MP1.

Each of the first magnetic pattern MP1 and the second magnetic pattern MP2 may include a Co-based Heusler alloy. The tunnel barrier pattern TBP may include at least one of a magnesium (Mg) oxide layer, a titanium (Ti) oxide layer, an aluminum (Al) oxide layer, a magnesium-zinc (Mg—Zn) oxide layer, or a magnesium-boron (Mg—B) oxide layer.

Referring back to FIGS. 2 and 3A to 3C, a capping insulating layer 150 may conformally cover each side surface of the data storage patterns DS and the recessed upper surface 130RU of the second lower insulating layer 130 on the cell region CR. The capping insulating layer 150 may conformally cover side surfaces of the lower electrode BE, the magnetic tunnel junction pattern MTJ, and the upper electrode TE. The capping insulating layer 150 may include nitride (e.g., silicon nitride).

A cell insulating layer 160 may be disposed on the second lower insulating layer 130 on the cell region CR and may cover the data storage patterns DS. The cell insulating layer 160 may fill a space between the data storage patterns DS. The capping insulating layer 150 may be interposed between the side surface of each of the data storage patterns DS and the cell insulating layer 160, and may extend between the recessed upper surface 130RU of the second lower insulating layer 130 on the cell region CR and the cell insulating layer 160.

The cell insulating layer 160 includes cell extending portions 160E extending onto the second lower insulating layer 130 on the peripheral region PR in the first direction D1. Each of the cell extending portions 160E may protrude from the cell insulating layer 160 on the cell region CR onto the second lower insulating layer 130 on the peripheral region PR in the first direction D1. The cell extending portions 160E may respectively extend onto the reference conductive lines 106 on the peripheral region PR in the first direction D1 and may be spaced apart from each other in the second direction D2. The cell extending portions 160E may vertically overlap the reference conductive lines 106 on the peripheral region PR in the third direction D3, respectively. The capping insulating layer 150 may extend between each of the cell extending portions 160E and the second lower insulating layer 130 on the peripheral region PR.

The cell insulating layer 160 may include, for example, silicon oxide, silicon nitride, and/or silicon oxynitride. For example, the cell insulating layer 160 may include tetraethyl ortho-silicate (TEOS) oxide.

An upper insulating layer 170 may be disposed on the cell insulating layer 160. The upper insulating layer 170 may be disposed on the cell insulating layer 160 on the cell region CR and may extend onto the cell extending portions 160E. The upper insulating layer 170 may include a material different from that of the cell insulating layer 160. The upper insulating layer 170 may include, for example, silicon nitride (e.g., SiCN).

A peripheral insulating layer 180 may be disposed on the second lower insulating layer 130 in the peripheral region PR. The upper surface 130U of the second lower insulating film 130 on the peripheral region PR may be positioned at a height lower than the recessed upper surface 130RU of the second lower insulating film 130 on the cell region PR, and the peripheral insulating layer 180 may be in contact with the upper surface 130U of the second lower insulating layer 130 on the peripheral region PR. The peripheral insulating layer 180 may be in contact with side surfaces 160ES of the cell extending portions 160E, and extend between the cell extending portions 160E and may be in contact with the side surface 160S of the cell insulating layer 160 on the cell region CR. The peripheral insulating layer 180 may be in contact with the side surface 170S of the upper insulating layer 170. An upper surface 180U of the peripheral insulating layer 180 may be positioned at the same height as an upper surface 170U of the upper insulating layer 170. The upper surface 180U of the peripheral insulating layer 180 may be coplanar with the upper surface 170U of the upper insulating layer 170.

The peripheral insulating layer 180 may include a material different from that of the cell insulating layer 160. The peripheral insulating layer 180 may include an insulating material having a smaller dielectric constant (k) than that of the cell insulating layer 160. The peripheral insulating layer 180 may include a material different from that of the upper insulating layer 170 and may include an insulating material having a lower dielectric constant (k) than that of the upper insulating layer 170. The peripheral insulating layer 180 may include, for example, silicon oxide, silicon nitride, and/or silicon oxynitride. For example, the peripheral insulating layer 180 may include an insulating material having a dielectric constant (k) smaller than about 2.5 or 2.0, and may include, for example, porous SiOC.

Cell conductive lines 200 may be disposed on the cell region CR. The cell conductive lines 200 may extend in the first direction D1 and may be spaced apart from each other in the second direction D2. Each of the cell conductive lines 200 may have a line shape extending in the first direction D1. The data storage patterns DS spaced apart from each other in the second direction D2 may be electrically connected to the cell conductive lines 200, respectively. The data storage patterns DS spaced apart from each other in the first direction D1 may be electrically connected to a corresponding one of the cell conductive lines 200. Each of the cell conductive lines 200 may pass through the upper insulating layer 170 and may pass through an upper portion of the cell insulating layer 160 to be connected to the data storage patterns DS. The cell conductive lines 200 may include a conductive material, for example, metal (e.g., copper). Each of the cell conductive lines 200 may correspond to the bit line BL of FIG. 1.

Figure 5A:
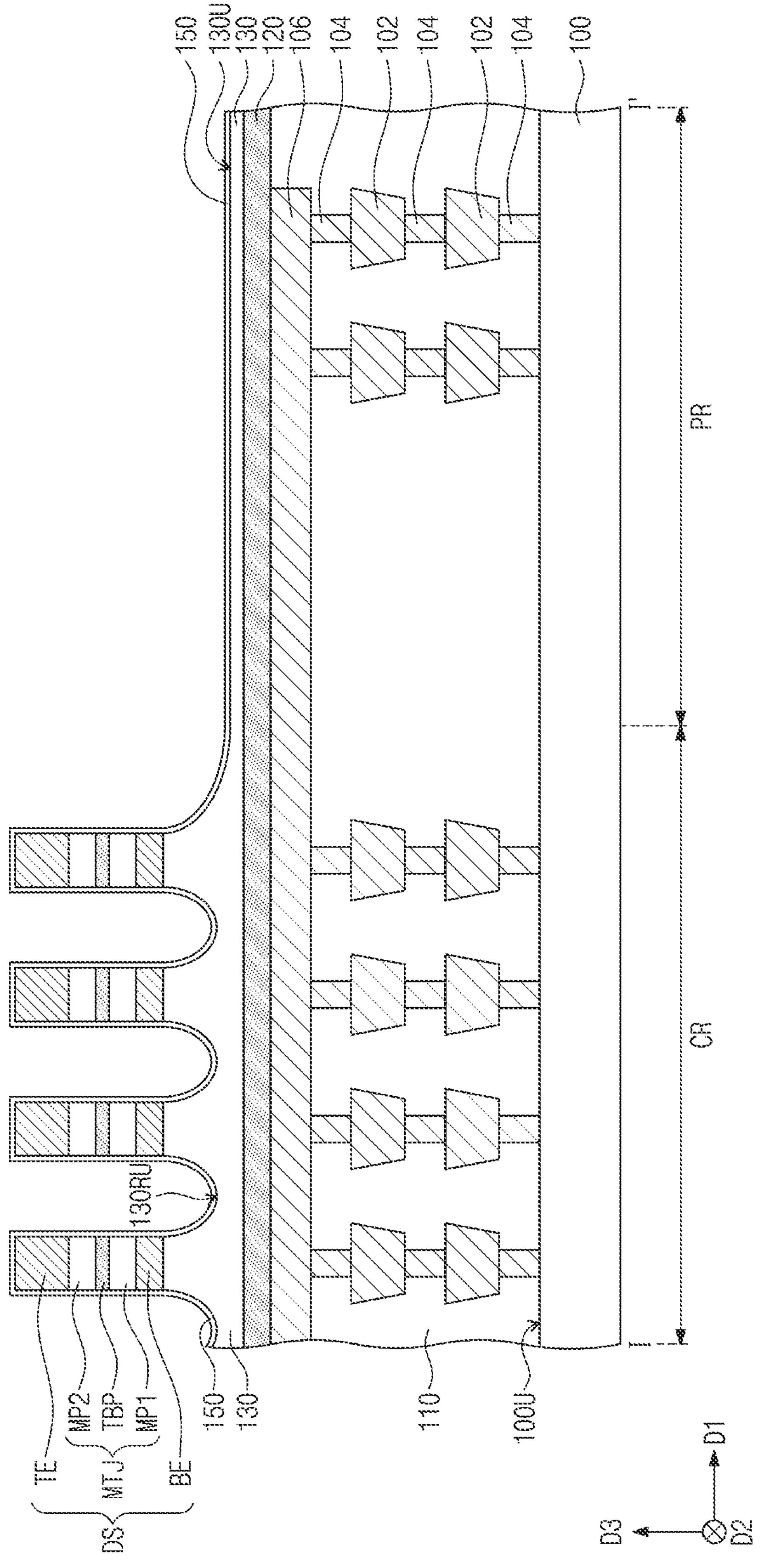
FIGS. 5A, 5B, 5C, 6A, 6B, 6C, 7A, 7B, 7C, 8A, 8B, 8C, 9A, 9B, 9C, 10A, 10B, and 10C are cross-sectional views illustrating a method of manufacturing a semiconductor device according to some implementations of the present disclosure.
Figure 5B:
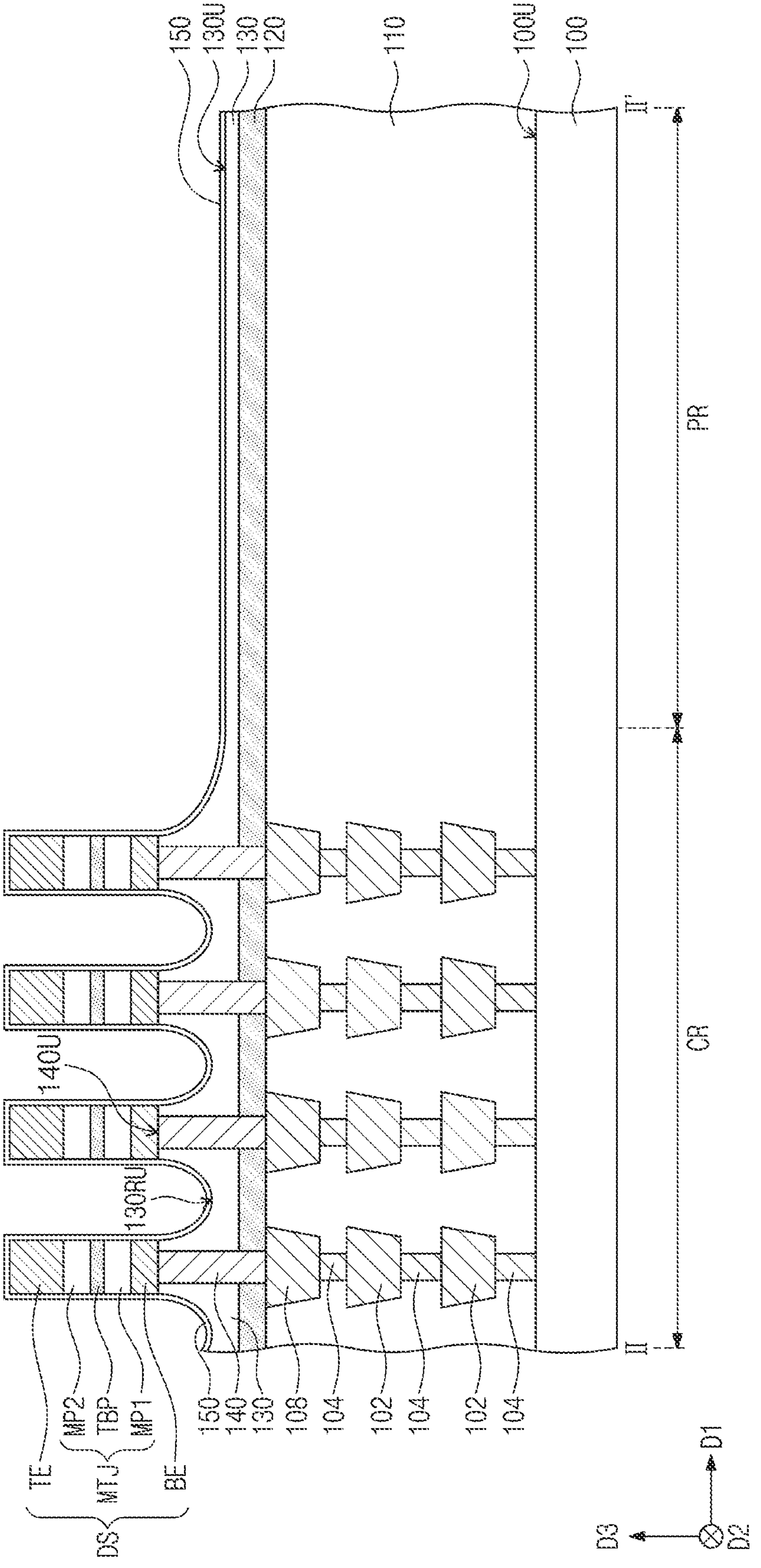
Figure 5C:
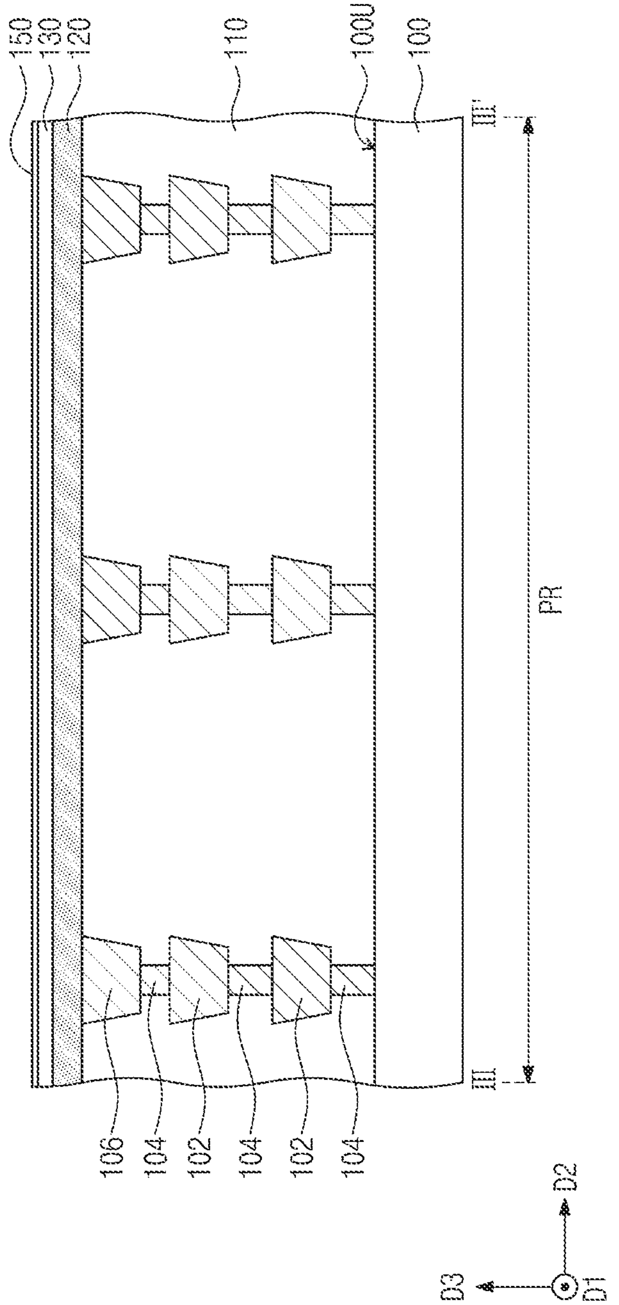
Figure 6A:
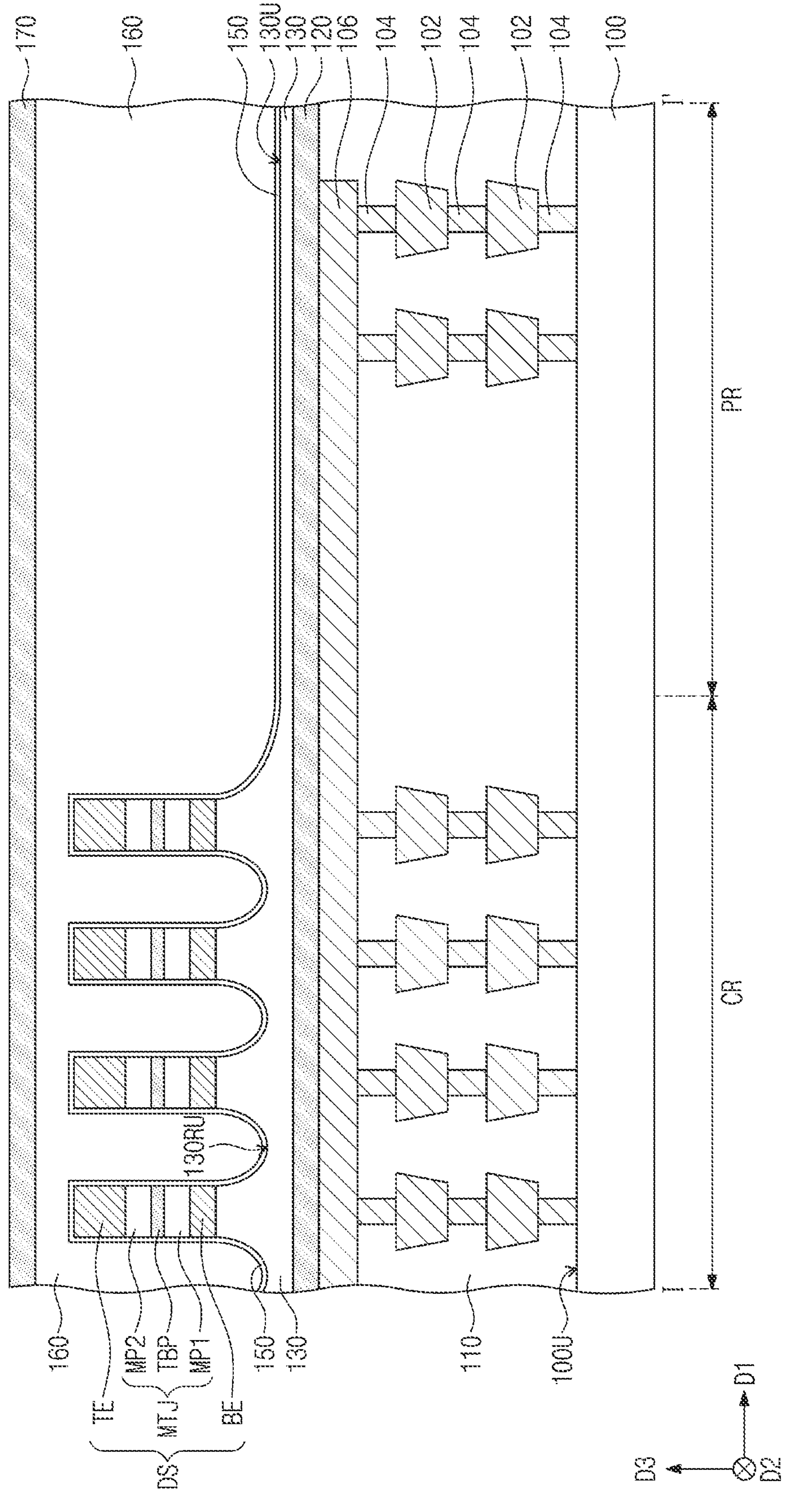
Figure 6B:
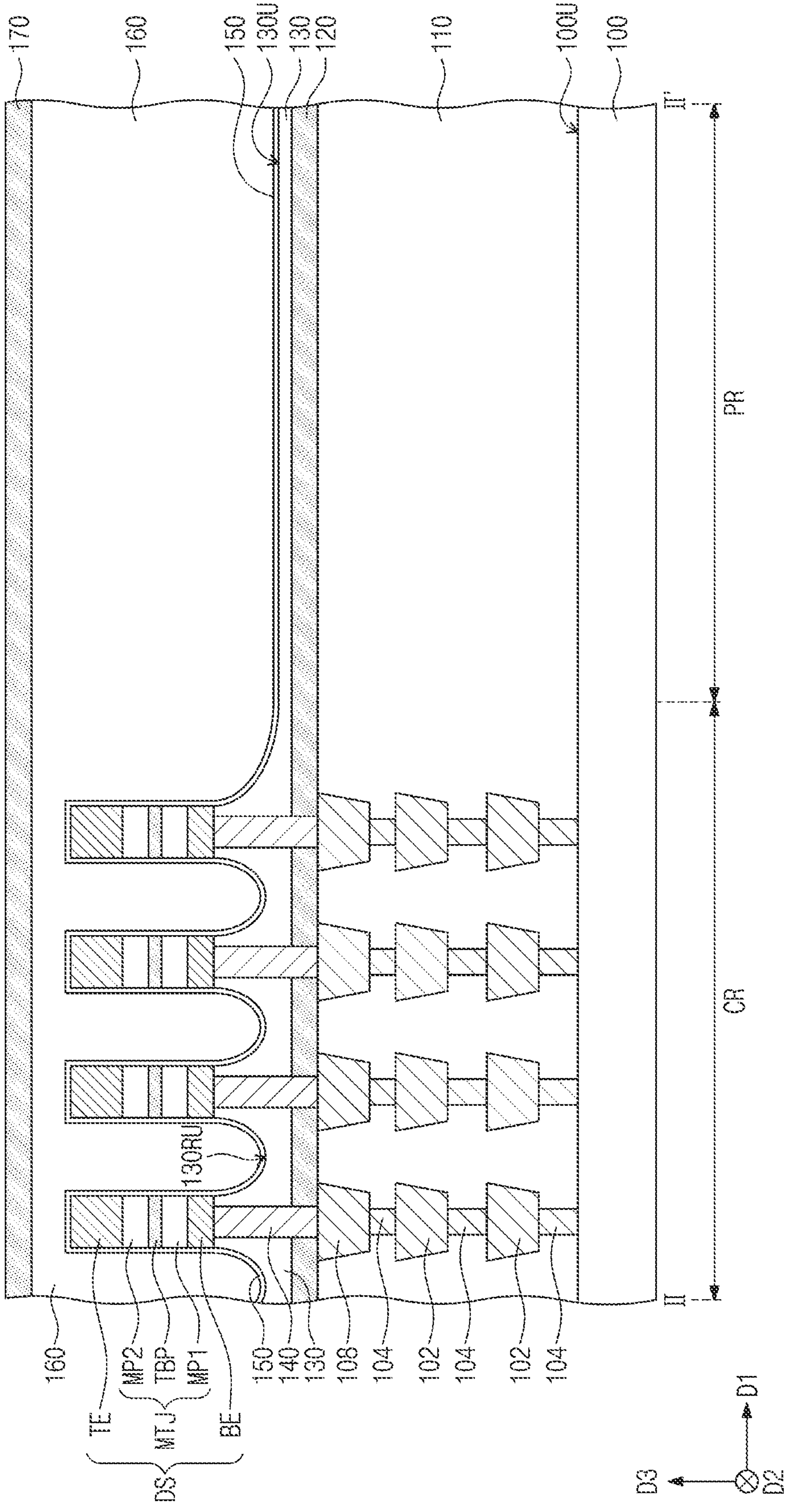
Figure 6C:
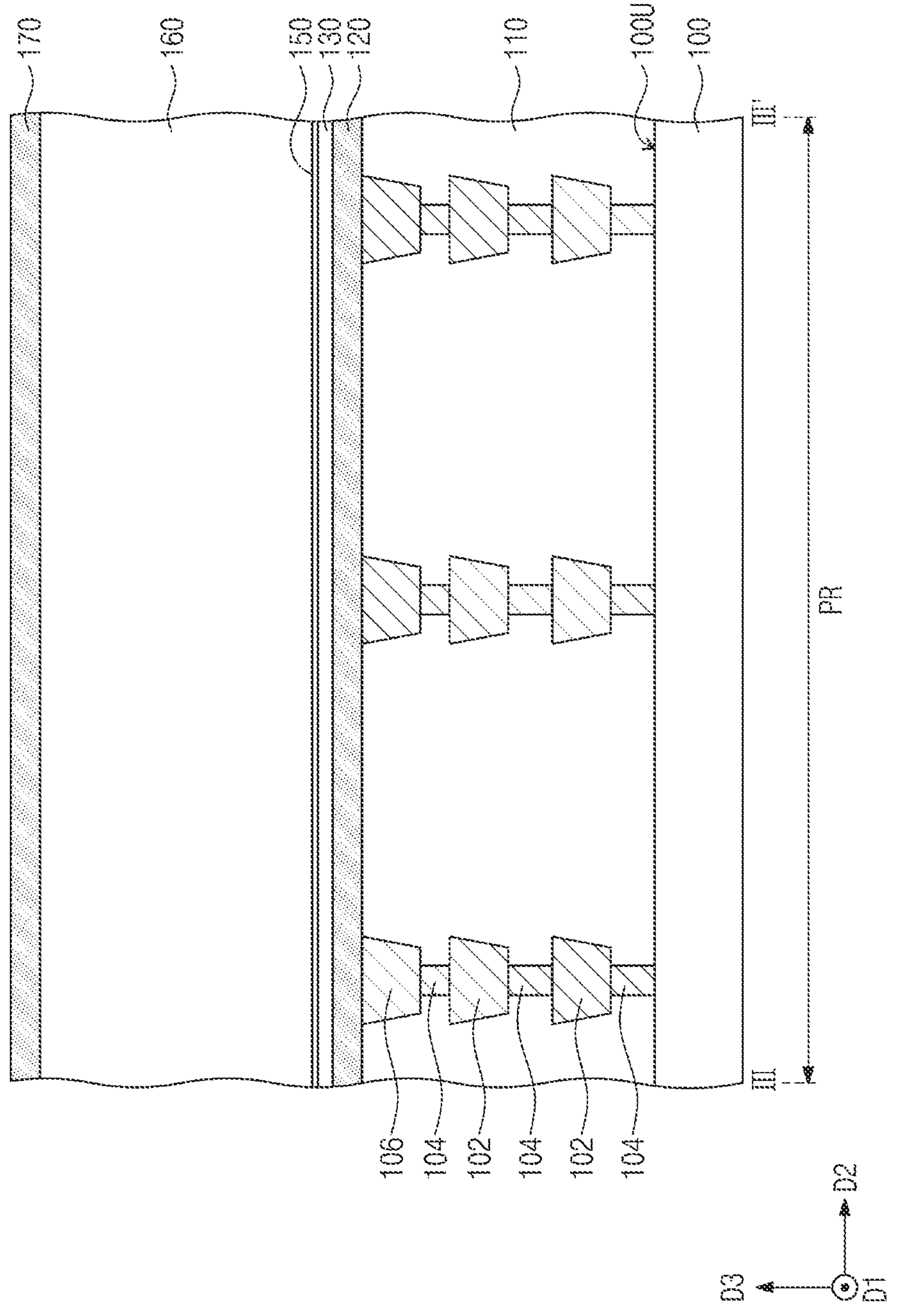
Figure 7A:
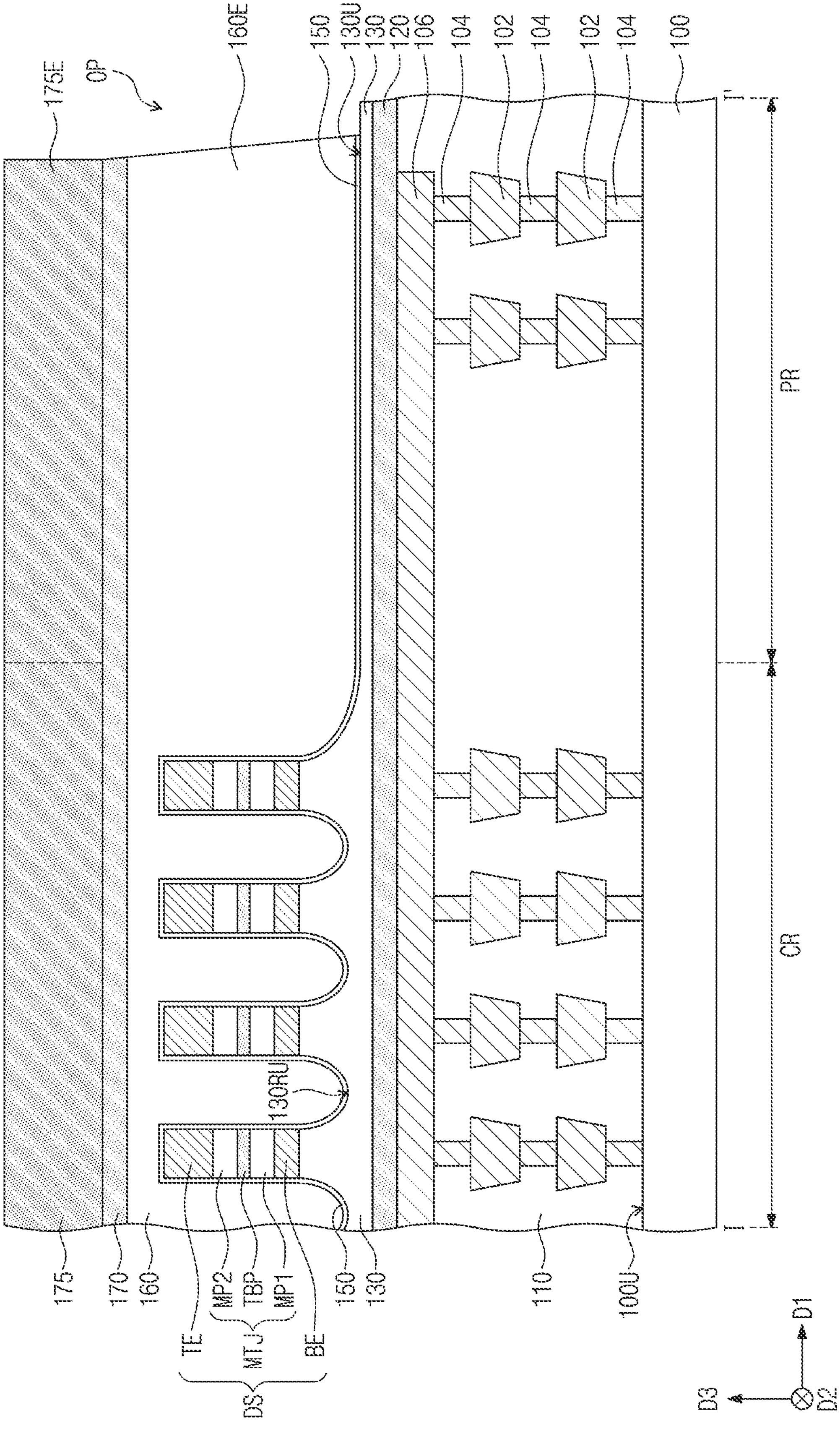
Figure 7B:
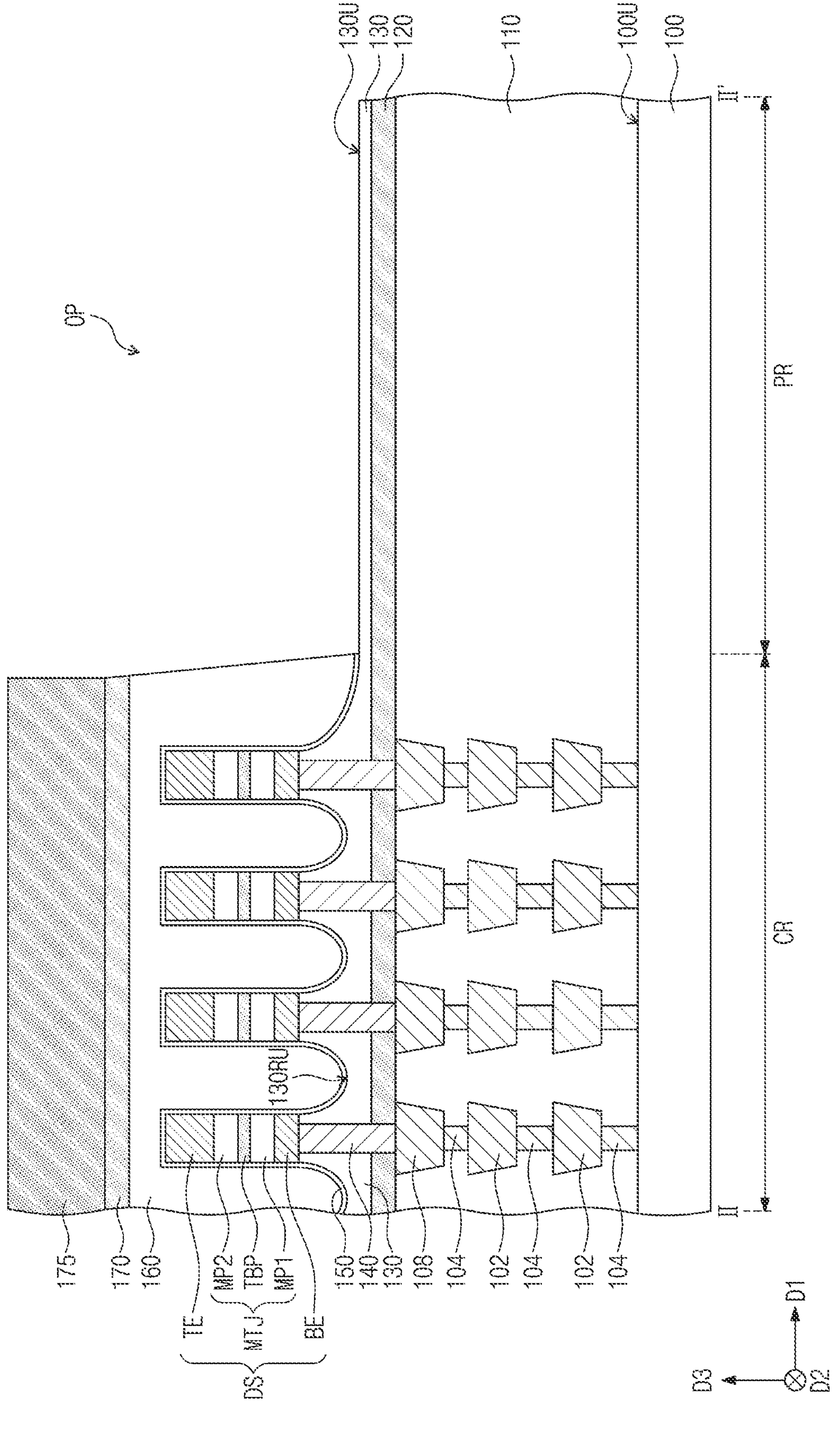
Figure 7C:
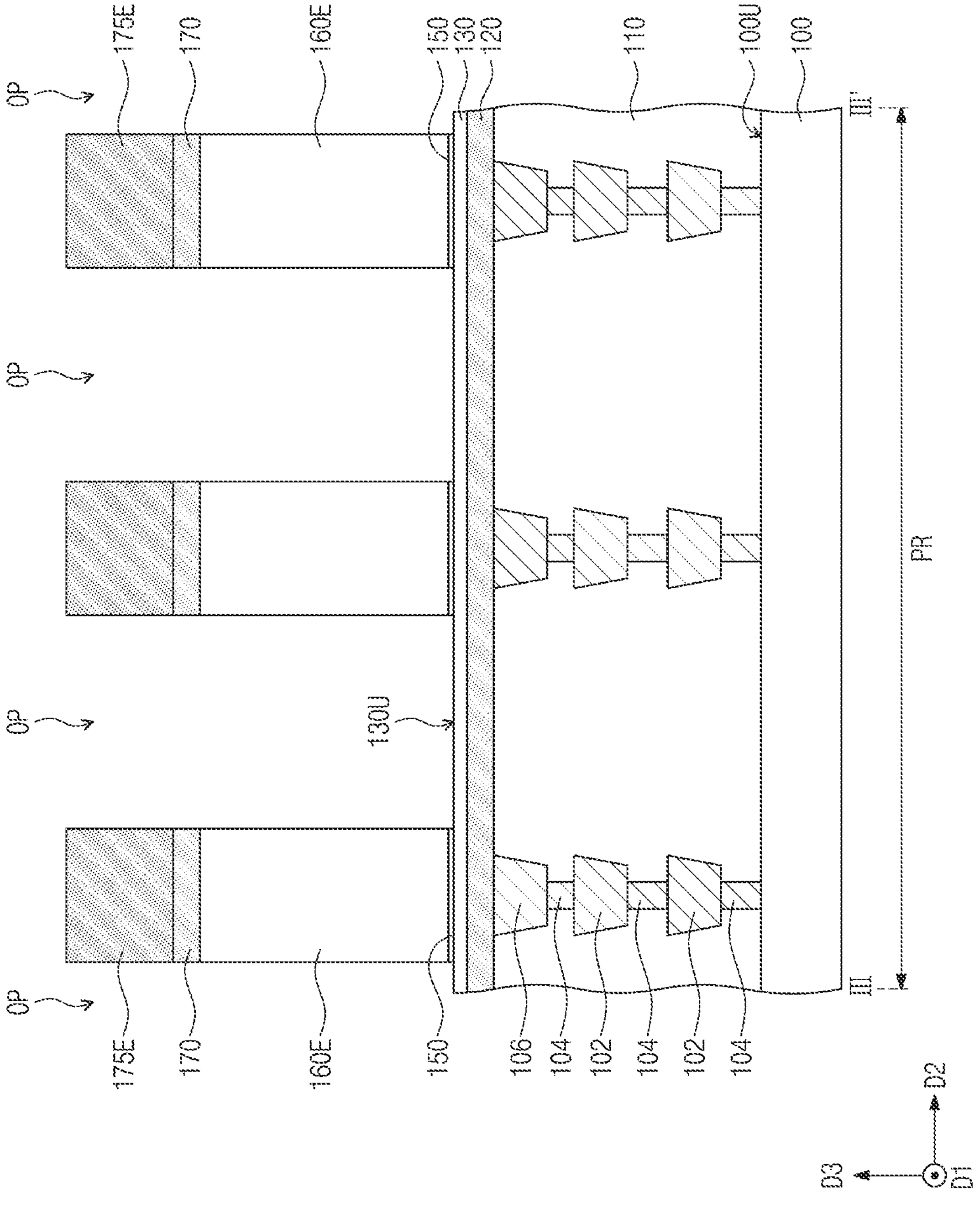
Figure 8A:
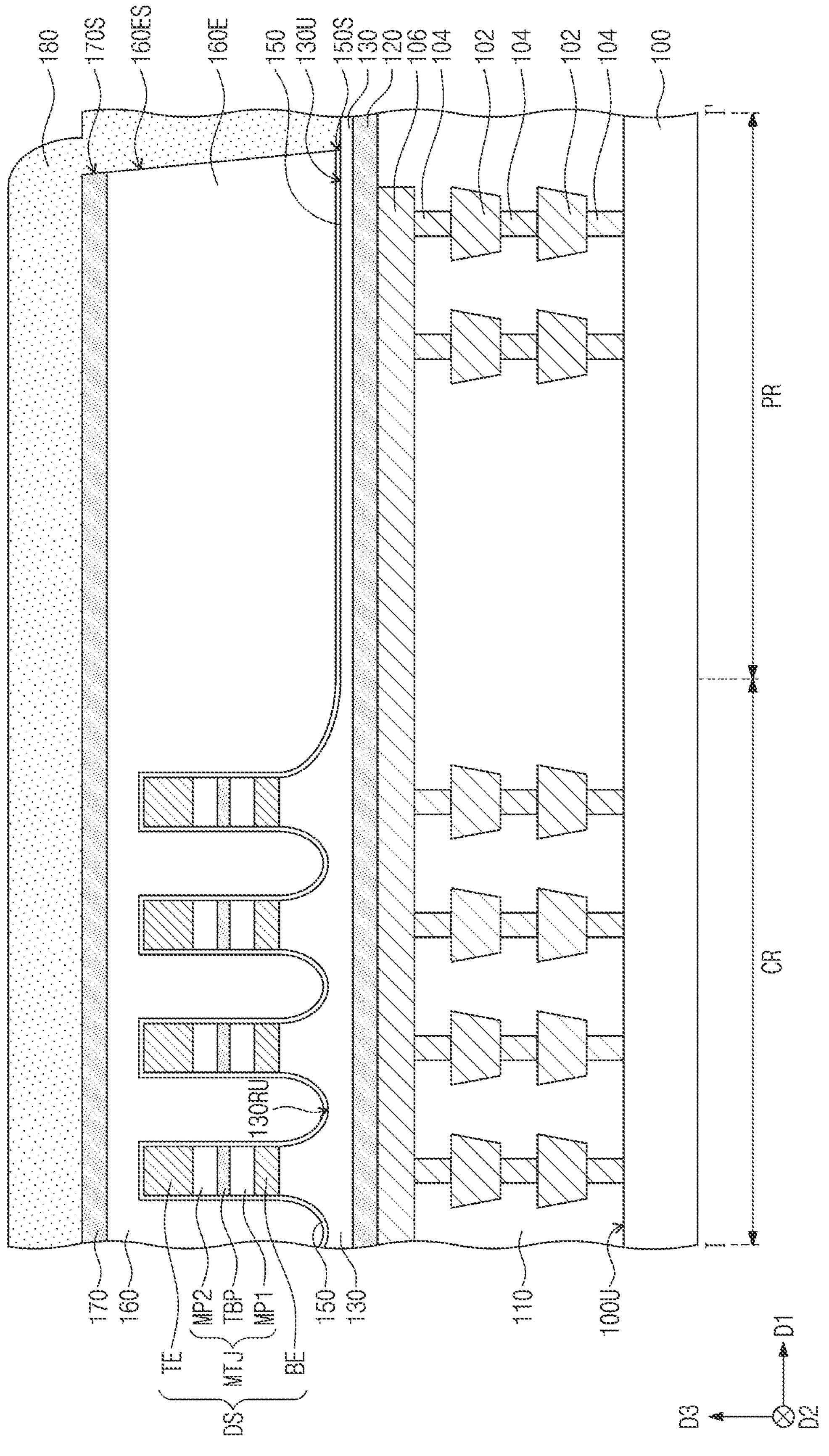
Figure 8B:
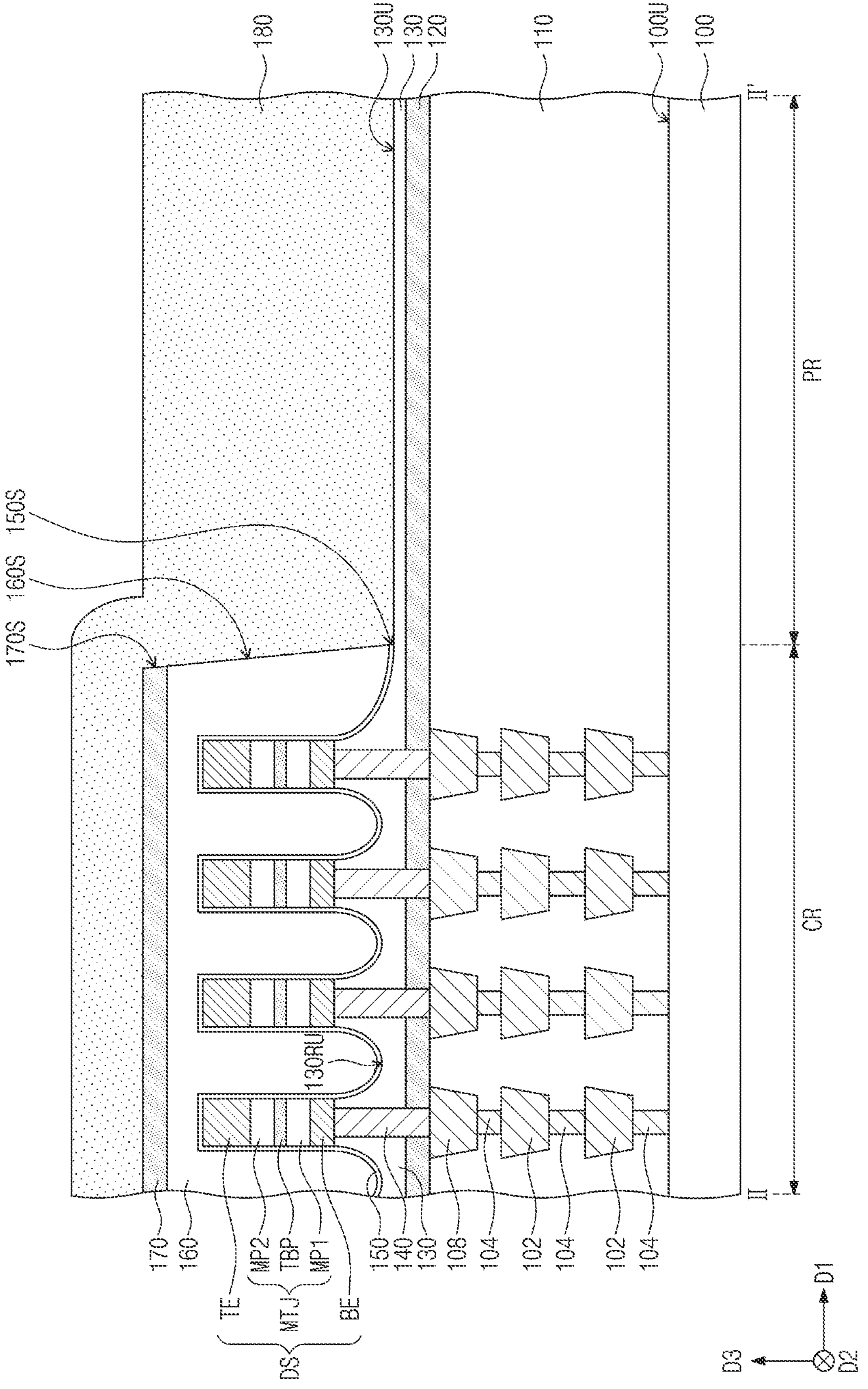
Figure 8C:
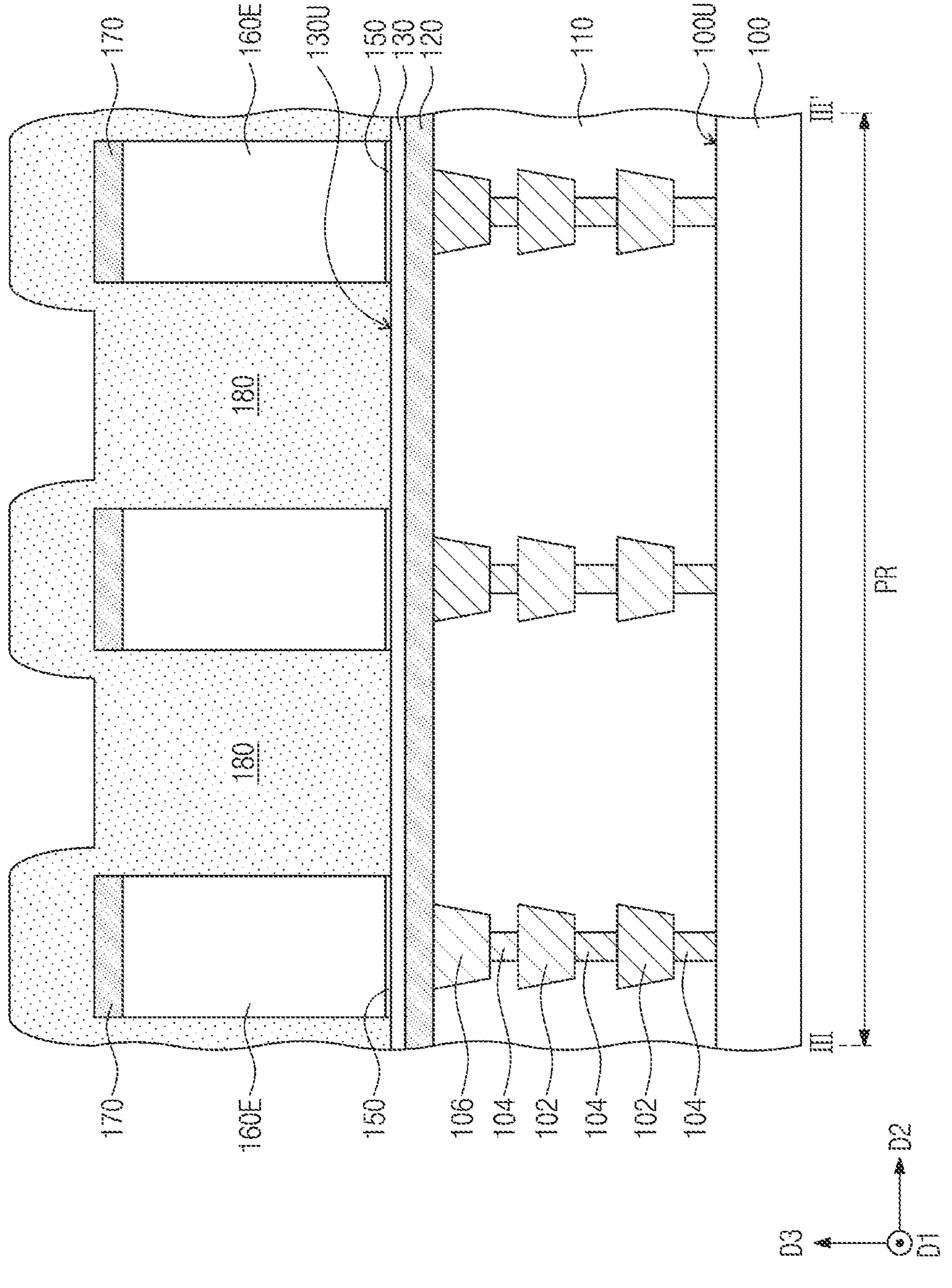
Figure 9A:
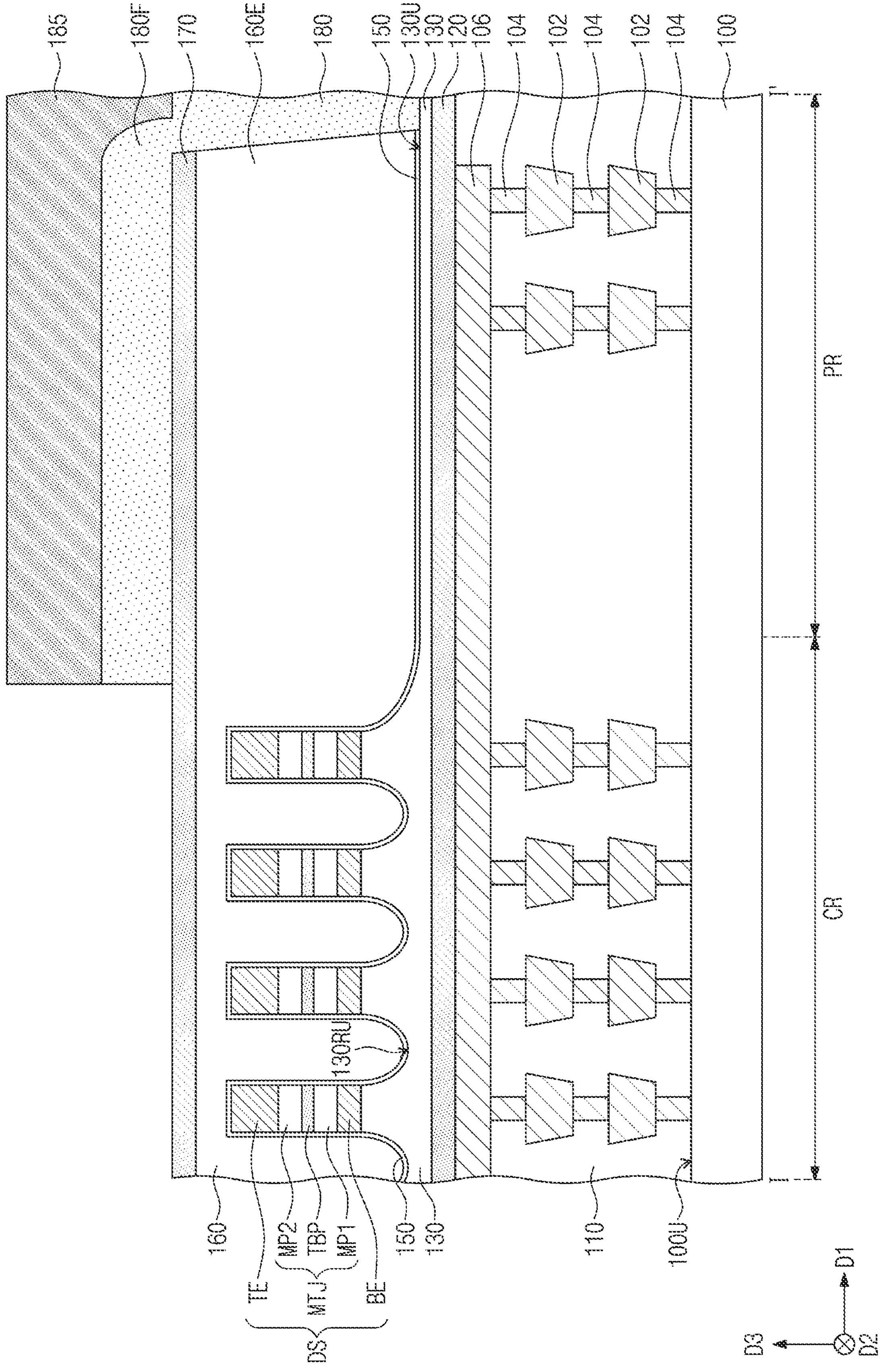
Figure 9B:
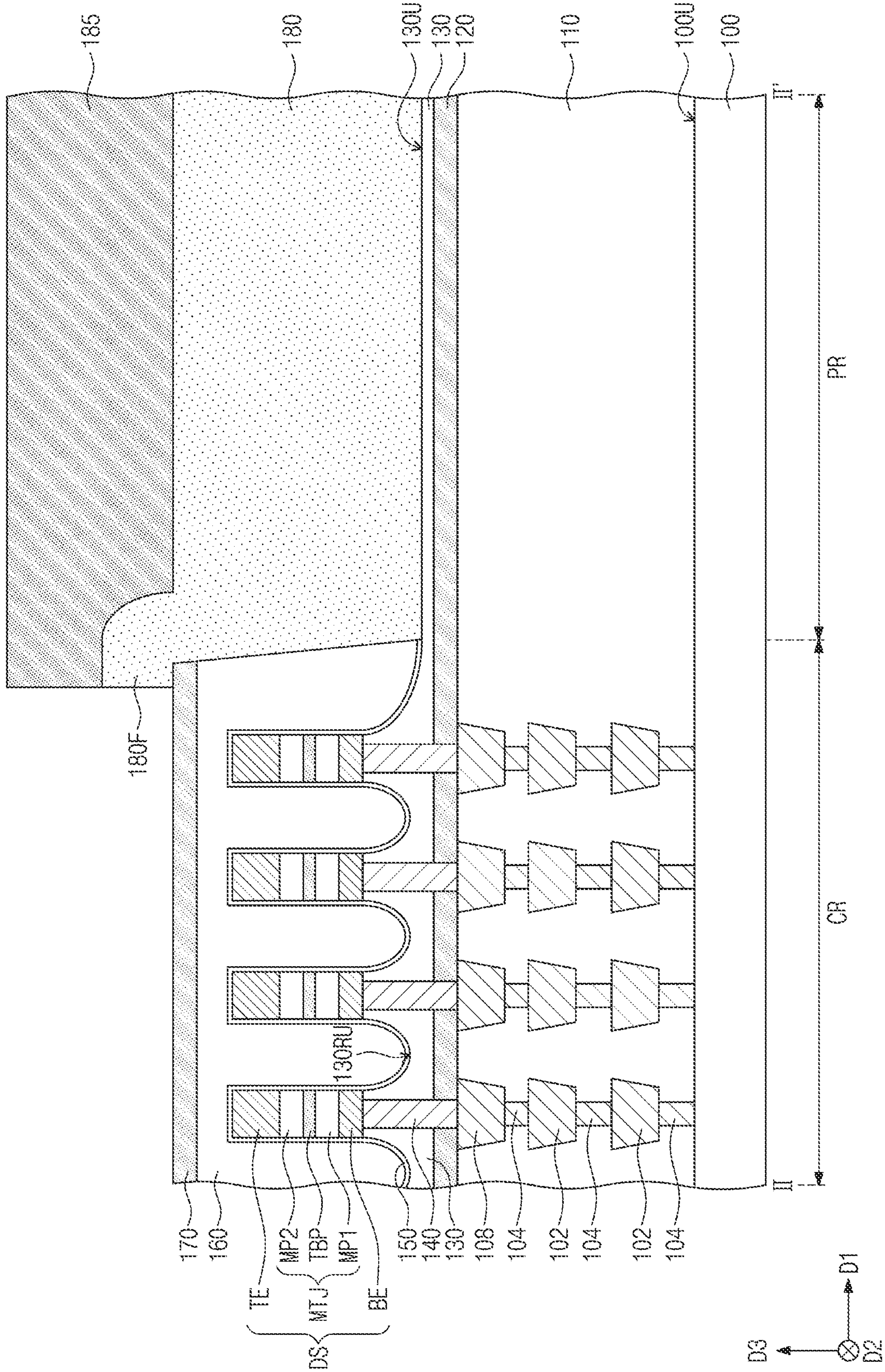
Figure 9C:
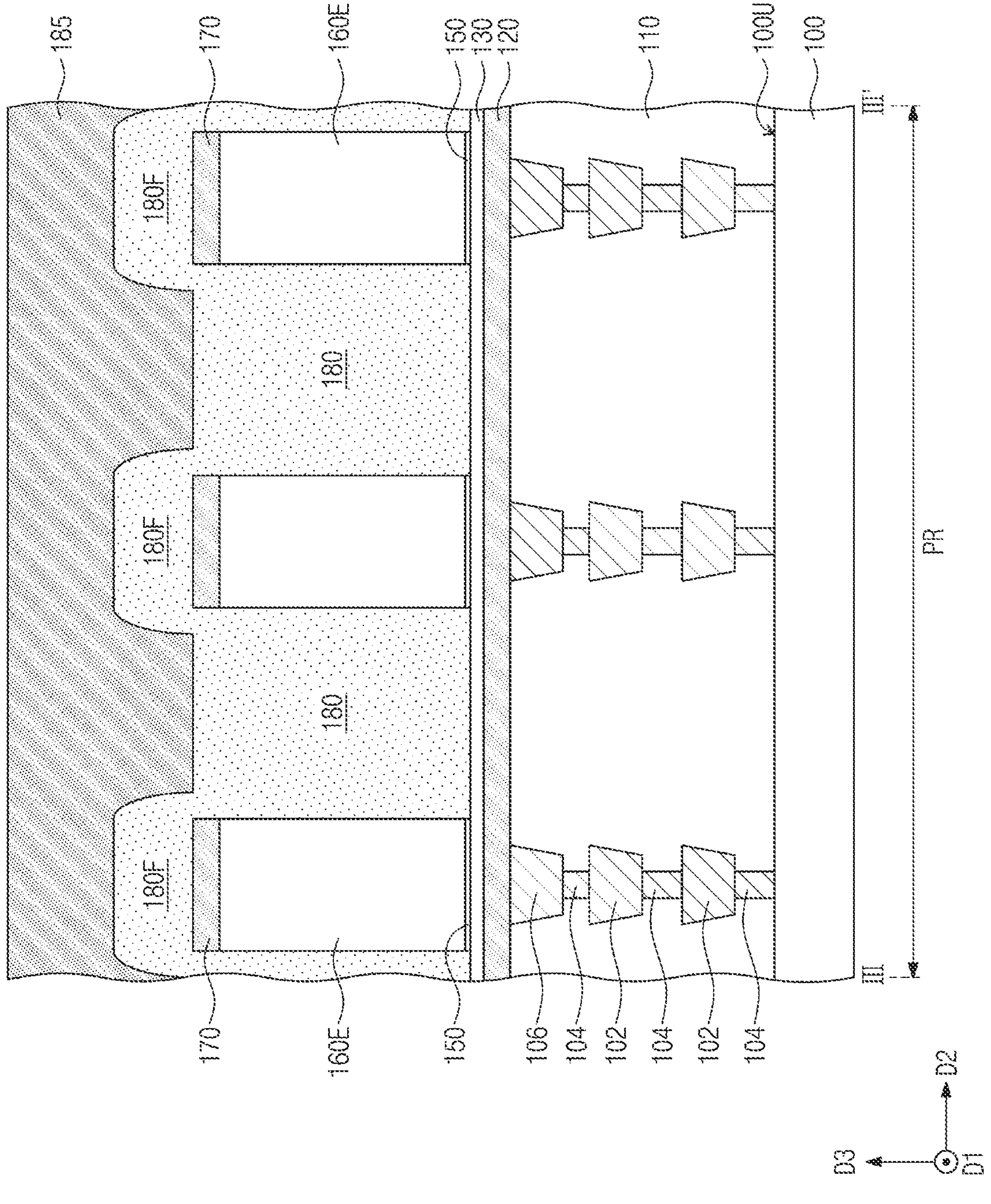
Figure 10A:
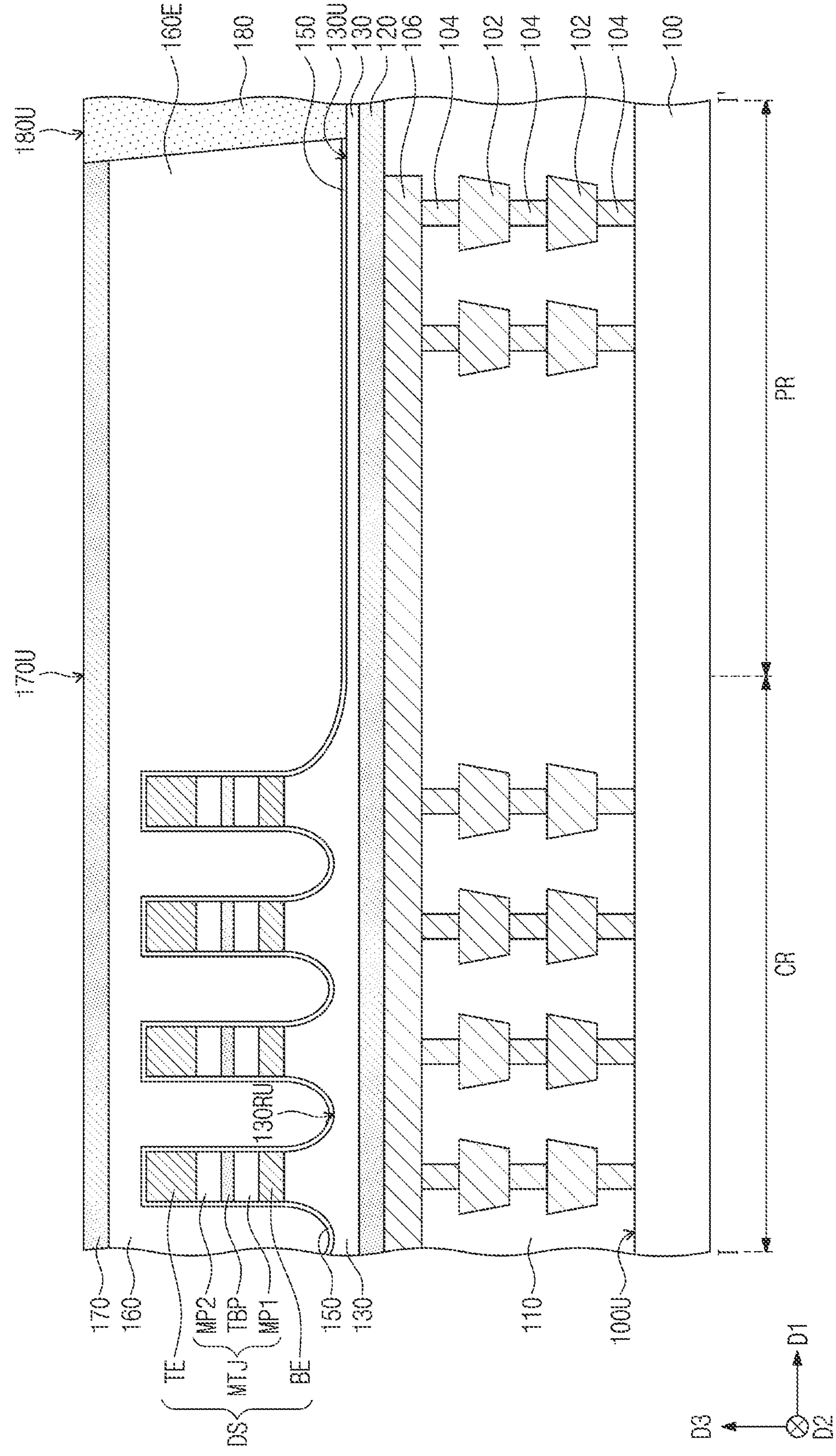
Figure 10B:
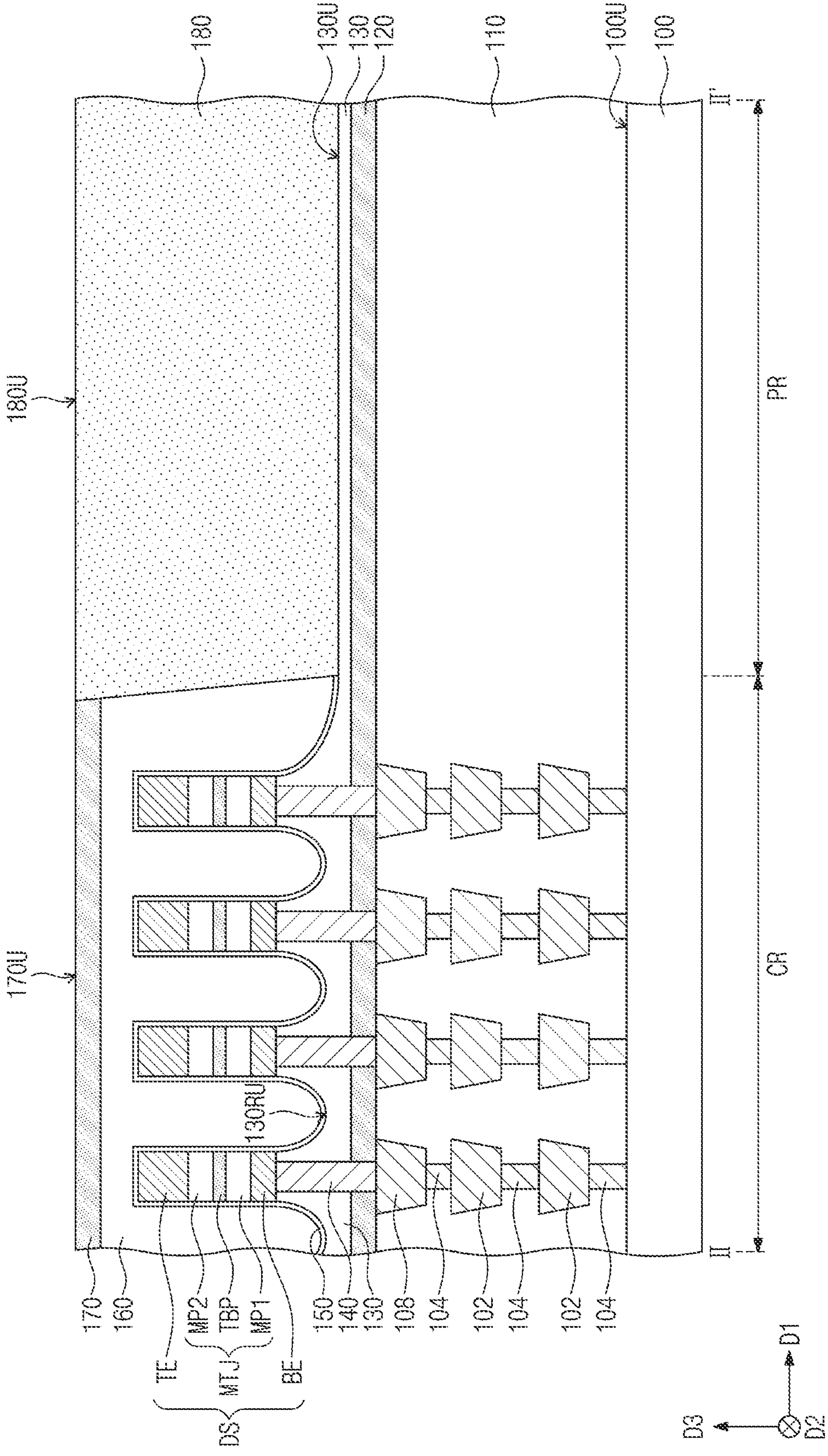
Figure 10C:
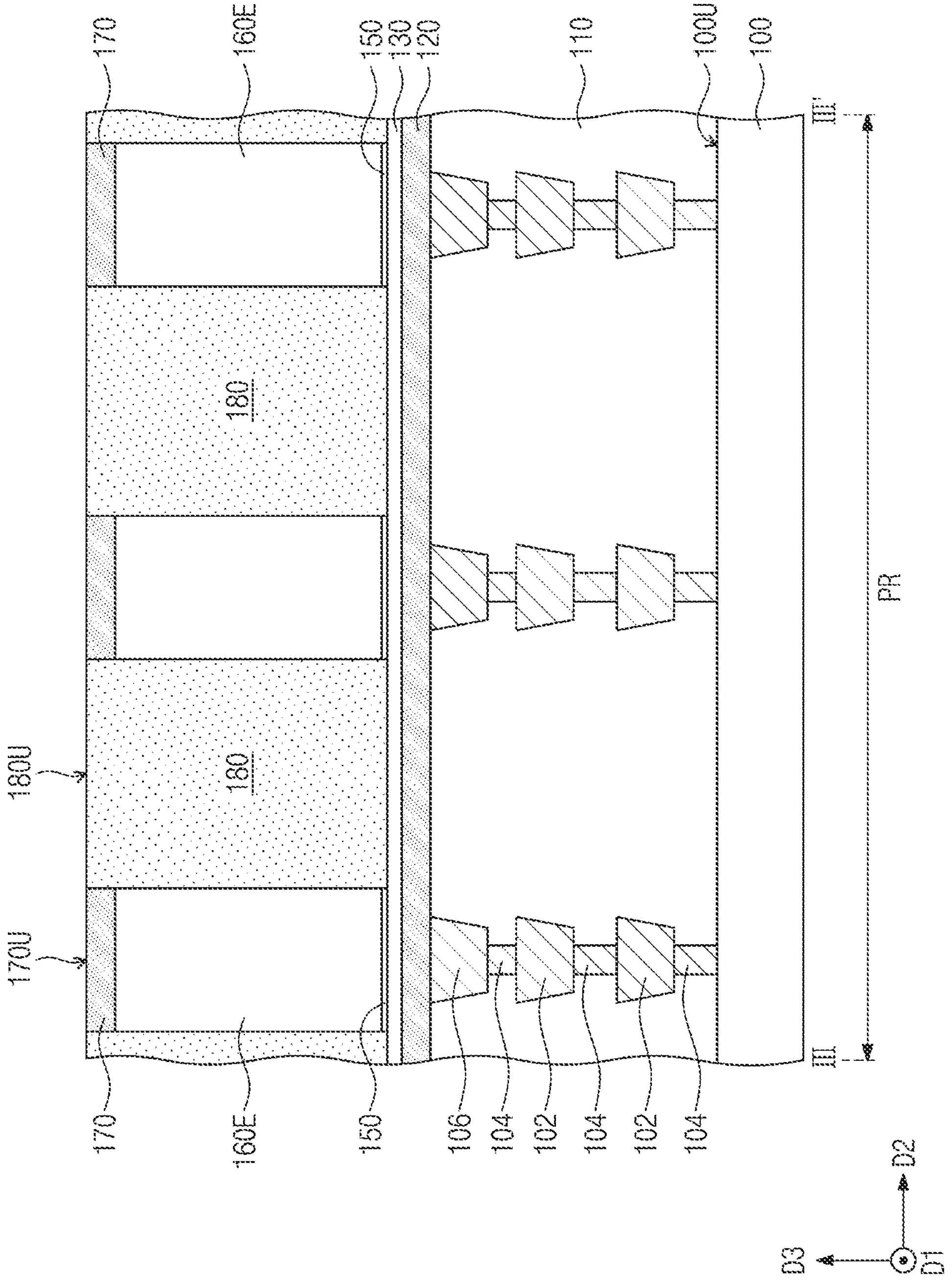

FIGS. 5A to 10C are cross-sectional views illustrating a method of manufacturing a semiconductor device according to some implementations of the present disclosure. FIGS. 5A, 6A, . . . and 10A are cross-sectional views corresponding to I-I' of FIG. 2, FIGS. 5B, 6B, . . . and 10B are cross-sectional views corresponding to II-II' of FIG. 2, and FIGS. 5C, 6C, . . . and 10C are cross-sectional views corresponding to III-III of FIG. 2. For simplicity of explanation, descriptions overlapping those of the semiconductor device described with reference to FIGS. 1, 2, 3A to 3C, and 4A and 4B are omitted.

Referring to FIGS. 2 and 5A to 5C, a substrate 100 including a cell region CR and a peripheral region PR is provided. Selection elements (SE in FIG. 1) and reference cells may be formed on the substrate 100, and wiring structures 102, 104, 106, and 108 may be formed on the selection elements and the reference cells. The wiring structures 102, 104, 106, and 108 may be formed on the cell region CR and the peripheral region PR of the substrate 100. The wiring structures 102, 104, 106, and 108 may include reference conductive lines 106 extending in the first direction D1 and spaced apart from each other in the second direction D2 on the cell region CR. The reference conductive lines 106 may extend onto the peripheral region PR in the first direction D1. The wiring structures 102, 104, 106, and 108 may further include lower conductive lines 108 disposed on the cell region CR. The lower conductive lines 108 may be positioned at the same height as the reference conductive lines 106 from the substrate 100. The wiring structures 102, 104, 106, and 108 may further include wiring lines 102 disposed between the substrate 100 and the reference conductive lines 106 and between the substrate 100 and the lower conductive lines 108, and wiring contacts 104 connected to the wiring lines 102. Each of the lower conductive lines 108 may be electrically connected to a terminal (e.g., a drain terminal) of a corresponding one of the selection elements through a corresponding wiring contact 104 and a corresponding wiring line 102. Each of the reference conductive lines 106 may be electrically connected to one terminal of a corresponding one of the reference cells through a corresponding wire contact 104 and a corresponding wire line 102.

A wiring insulating layer 110 may be formed on the substrate 100 and may cover the wiring structures 102, 104, 106, and 108. The wiring insulating layer 110 may expose upper surfaces of the reference conductive lines 106 and the lower conductive lines 108.

A first lower insulating layer 120 may be formed on the wiring insulating layer 110. The first lower insulating layer

120 may be formed on the wiring insulating layer 110 on the cell region CR and may extend onto the wiring insulating layer 110 on the peripheral region PR. The first lower insulating layer 120 may cover the exposed upper surfaces of the reference conductive lines 106 and the lower conductive lines 108.

A second lower insulating layer 130 may be formed on the first lower insulating layer 120. The second lower insulating layer 130 may be formed on the first lower insulating layer 120 on the cell region CR and may extend onto the first lower insulating layer 120 on the peripheral region PR.

Lower electrode contacts 140 may be formed in the second lower insulating layer 130 on the cell region CR. Each of the lower electrode contacts 140 may pass through the first and second lower insulating layers 120 and 130 on the cell region CR, and may be electrically connected to one of the lower conductive lines 108. Forming the lower electrode contacts 140 may include forming lower contact holes passing through the first and second lower insulating layers 120 and 130 on the cell region CR, forming a lower contact layer filling the lower contact holes on the second lower insulating layer 130, and planarizing the lower contact layer until an upper surface of the second lower insulating layer 130 is exposed. Through the planarization process, the lower electrode contacts 140 may be locally formed in the lower contact holes, respectively.

Data storage patterns DS may be formed on the second lower insulating layer 130 on the cell region CR. The lower electrode contacts 140 may be respectively disposed below corresponding data storage patterns DS among the data storage patterns DS, and may be electrically connected to the corresponding data storage patterns DS, respectively. The data storage patterns DS may include dummy data storage patterns DS which are not connected to the lower electrode contacts 140.

Each of the data storage patterns DS may include a lower electrode BE, a magnetic tunnel junction pattern MTJ, and an upper electrode TE sequentially stacked on the second lower insulating layer 130. The magnetic tunnel junction pattern MTJ may include a first magnetic pattern MP1, a second magnetic pattern MP2, and a tunnel barrier pattern TBP therebetween. The first magnetic pattern MP1 may be disposed between the lower electrode BE and the tunnel barrier pattern TBP, and the second magnetic pattern MP2 may be disposed between the upper electrode TE and the tunnel barrier pattern TBP. Forming the data storage patterns DS may include, for example, sequentially forming a lower electrode layer and a magnetic tunnel junction layer on the second lower insulating layer 130, forming a conductive mask pattern on the magnetic tunnel junction layer, and sequentially etching the magnetic tunnel junction layer and the lower electrode layer using the conductive mask pattern as an etching mask. The magnetic tunnel junction layer may include a first magnetic layer, a tunnel barrier layer, and a second magnetic layer sequentially stacked on the lower electrode layer. The magnetic tunnel junction layer and the lower electrode layer may be formed by, for example, sputtering, chemical vapor deposition, or atomic layer deposition.

As the magnetic tunnel junction layer and the lower electrode layer are etched, the magnetic tunnel junction pattern MTJ and the lower electrode BE may be formed, respectively. Etching the magnetic tunnel junction layer may include sequentially etching the second magnetic layer, the tunnel barrier layer, and the first magnetic layer using the conductive mask pattern as an etch mask. The second magnetic layer, the tunnel barrier layer, and the first magnetic layer may be etched to form the second magnetic pattern MP2, the tunnel barrier pattern TBP, and the first magnetic pattern MP1, respectively. A remainder of the conductive mask pattern remaining on the magnetic tunnel junction pattern MTJ after etching the magnetic tunnel junction layer and the lower electrode layer may refer to the upper electrode TE.

The etching process of etching the magnetic tunnel junction layer and the lower electrode layer may be, for example, an ion beam etching process using an ion beam. The ion beam may include inert ions. During the etching process, an upper portion of the second lower insulating layer 130 between the data storage patterns DS may be recessed. Accordingly, the second lower insulating layer 130 on the cell region CR may have a recessed upper surface 130RU that is recessed toward the substrate 100. The recessed upper surface 130RU of the second lower insulating layer 130 may be positioned at a height lower than upper surfaces 140U of the lower electrode contacts 140. In addition, an upper portion of the second lower insulating layer 130 on the peripheral region PR may be recessed by the etching process. An upper surface 130U of the second lower insulating layer 130 on the peripheral region PR may be positioned at a height lower than the recessed upper surface 130RU of the second lower insulating layer 130 on the cell region CR.

A capping insulating layer 150 may be formed on the second lower insulating layer 130 on the cell region CR and may conformally cover upper and side surfaces of each of the data storage patterns DS. The capping insulating layer 150 may conformally cover the recessed upper surface 130RU of the second lower insulating layer 130 on the cell region CR, and may extend onto the second lower insulating layer 130 on the peripheral region PR.

Referring to FIGS. 2 and 6A to 6C, a cell insulating layer 160 is formed on the capping insulating layer 150. The cell insulating layer 160 may be formed on the capping insulating layer 150 on the cell region CR to cover the data storage patterns DS and may fill a space between the data storage patterns DS. The cell insulating layer 160 may extend onto the capping insulating layer 150 on the peripheral region PR. The cell insulating layer 160 may be formed using, for example, a high density plasma chemical vapor deposition (HDP CVD) process.

An upper insulating layer 170 may be formed on the cell insulating layer 160. The upper insulating layer 170 may be formed on the cell insulating layer 160 on the cell region CR and may extend onto the cell insulating layer 160 on the peripheral region PR.

Referring to FIGS. 2 and 7A to 7C, a cell mask pattern 175 is formed on the upper insulating layer 170 on the cell region CR. The cell mask pattern 175 may include cell mask extending portions 175E extending onto the upper insulating layer 170 in the peripheral region PR in the first direction D1. Each of the cell mask extending portions 175E may protrude from the cell mask pattern 175 on the cell region CR onto the upper insulating layer 170 on the peripheral region PR in the first direction D1. The cell mask extending portions 175E may respectively extend onto the reference conductive lines 106 on the peripheral region PR in the first direction D1, and may be spaced apart from each other in the second direction D2. The cell mask extending portions 175E may vertically overlap the reference conductive lines 106 on the peripheral region PR in the third direction D3, respectively.

The cell mask pattern 175 may cover the upper insulating layer 170 on the cell region CR, and the cell mask extending portions 175E may cover portions of the upper insulating layer 170 on the peripheral region PR. The cell mask pattern 175 may expose a remainder of the upper insulating layer 170 on the peripheral region PR. The cell mask pattern 172 may be, for example, a photoresist pattern.

As an etching process using the cell mask pattern 175 as an etch mask is performed, the upper insulating layer 170, the cell insulating layer 160, and the capping insulating layer 150 may be removed on the peripheral region PR. Accordingly, a peripheral opening OP exposing the upper surface 130U of the second lower insulating layer 130 on the peripheral region PR may be formed.

By the etching process, the cell insulating layer 160 may be disposed on the second lower insulating layer 130 on the cell region CR, and may include cell extending portions 160E extending onto the second lower insulating layer 130 on the peripheral region PR in the first direction D1. Each of the cell extending portions 160E may protrude from the cell insulating layer 160 on the cell region CR onto the second lower insulating layer 130 on the peripheral region PR in the first direction D1. The cell extending portions 160E may respectively extend onto the reference conductive lines 106 on the peripheral region PR in the first direction D1 and may be spaced apart from each other in the second direction D2. The cell extending portions 160E may vertically overlap the reference conductive lines 106 on the peripheral region PR in the third direction D3, respectively. The peripheral opening OP may extend between the cell extending portions 160E, and may expose the upper surface 130U of the second lower insulating layer 130 on the peripheral region PR between the cell extending portions 160E.

The capping insulating layer 150 may be interposed between the side surface of each of the data storage patterns DS and the cell insulating layer 160, and may extend between the recessed upper surface 130RU of the second lower insulating layer 130 on the cell region CR and the cell insulating layer 160. The capping insulating layer 150 may extend between each of the cell extending portions 160E and the second lower insulating layer 130 on the peripheral region PR. The upper insulating layer 170 may be disposed on the cell insulating layer 160 on the cell region CR and may extend onto the cell extending portions 160E.

When the cell mask pattern 175 is locally formed on the upper insulating layer 170 on the cell region CR (i.e., when the cell mask pattern 175 does not include the cell mask extending portion 175E), the reference conductive lines 106 on the peripheral region PR may overlap the peripheral opening OP vertically (e.g., in the third direction D3). In this case, the first and second lower insulating layers 120 and 130 on the peripheral region PR and the reference conductive lines 106 on the peripheral region PR may be recessed by the etching process of forming the peripheral opening OP. Accordingly, defects in the reference conductive lines 106 may occur.

According to some implementations, the cell mask pattern 175 may include the cell mask extending portions 175E, and thus, the cell insulating layer 160 may include the cell extension portions 160E vertically overlapping (e.g., in the third direction D3) the reference conductive lines 106 on the peripheral region PR. During the etching process of forming the peripheral opening OP, the reference conductive lines 106 on the peripheral region PR may be protected by the cell mask extending portions 175E and the cell extending portions 160E, and accordingly, it is possible to prevent upper portions of the reference conductive lines 106 from being recessed by the etching process. As a result, defects of the reference conductive lines 106 may be prevented.

Referring to FIGS. 2 and 8A to 8C, the cell mask pattern 175 is removed. The cell mask pattern 175 may be removed using, for example, an ashing and/or a strip process.

A peripheral insulating layer 180 is formed on the upper insulating layer 170 and may fill the peripheral opening OP. The peripheral insulating layer 180 may be in contact with the upper surface 130U of the second lower insulating layer 130 on the peripheral region PR. The peripheral insulating layer 180 may be in contact with side surfaces 160ES of the cell extending portions 160E, and may extend between the cell extending portions 160E to be in contact with the side surface 1605 of the cell insulating layer 160 on the cell region CR. The peripheral insulating layer 180 may be in contact with the side surface 170S of the upper insulating layer 170. The peripheral insulating layer 180 may be formed using, for example, a chemical vapor deposition process.

Referring to FIGS. 2 and 9A to 9C, a peripheral mask pattern 185 is formed on the peripheral insulating layer 180 on the peripheral region PR, and may expose the peripheral insulating layer 180 on the cell region CR. The peripheral mask pattern 185 may be, for example, a photoresist pattern. An etching process may be performed using the peripheral mask pattern 185 as an etching mask to remove the peripheral insulating layer 180 on the cell region CR.

Accordingly, an upper insulating layer 170 on the cell region CR may be exposed. As the peripheral insulating layer 180 on the cell region CR is removed, the peripheral insulating layer 180 includes a peripheral fence 180F remaining on the cell extension portions 160E and on an edge of the cell insulating layer 160 on the cell region CR. The peripheral fence 180F may extend from the peripheral insulating layer 180 on the peripheral region PR onto the cell extending portions 160E and onto the edge of the cell insulating layer 160 on the cell region CR. The peripheral fence 180F may extend over the upper insulating layer 170 on the cell extending portions 160E and the upper insulating layer 170 on the edge of the cell insulating layer 160 on the cell region CR.

Referring to FIGS. 2 and 10A to 10C, the peripheral mask pattern 185 is removed. The peripheral mask pattern 185 may be removed using, for example, an ashing and/or a strip process. Thereafter, the peripheral fence 180F may be removed on the cell extending portions 160E and on the edge of the cell insulating layer 160 on the cell region CR by a planarization process. By the planarization process, an upper surface 180U of the peripheral insulating layer 180 may be positioned at the same height as an upper surface 170U of the upper insulating layer 170. The upper surface 180U of the peripheral insulating layer 180 may be coplanar with the upper surface 170U of the upper insulating layer 170. The planarization process may be, for example, a chemical mechanical polishing process or an etch-back process.

When the cell insulating layer 160 does not include the cell extending portions 160E, the cell insulating layer 160 may be locally disposed on the cell region CR, and the peripheral fence 180F may be formed on the edge of the cell insulating layer 160. In this case, loss of the edge of the cell insulating layer 160 and the upper insulating layer 170 on the edge of the cell insulating layer 160 may occur due to the planarization process, and thus it may be difficult to form cell conductive lines 200 to be described later in a region adjacent to the edge of the cell insulating layer 160.

According to some implementations, the cell insulating layer 160 includes the cell extending portions 160E protruding onto the peripheral region PR. During the planarization process for removing the peripheral fence 180F, loss of the edge of the cell insulating layer 160 and the upper portion on the edge of the cell insulating layer 160 may be suppressed due to pattern density of the cell extending portions 160E. Accordingly, forming cell conductive lines 200 to be described later may be facilitated.

Referring back to FIGS. 2 and 3A to 3C, cell conductive lines 200 are formed on the cell region CR. The cell conductive lines 200 may extend in the first direction D1 and may be spaced apart from each other in the second direction D2. Forming the cell conductive lines 200 may include, for example, forming cell trenches in the upper insulating layer 170 and the cell insulating layer 160 on the cell region CR, forming a conductive layer filling the cell trenches on the upper insulating layer 170 and the peripheral insulating layer 180, and planarizing the conductive layer until the upper surfaces 170U and 180U of the upper insulating layer 170 and the peripheral insulating layer 180 are exposed. Each of the cell conductive lines 200 may pass through the upper insulating layer 170 and may pass through an upper portion of the cell insulating layer 160 to be connected to the data storage patterns DS.

According to some implementations, the cell insulating layer 160 may include the cell extending portions 160E vertically overlapping (e.g., in the third direction D3) the reference conductive lines 106 on the peripheral region PR. During the etching process of forming the peripheral opening OP, the reference conductive lines 106 on the peripheral region PR may be protected by the cell extending portions 160E, and thus defects of the reference conductive lines 106 may be prevented. In addition, the cell extending portions 160E may protrude from the cell insulating layer 160 on the cell region CR to the peripheral region PR. In this case, during the planarization process for removing the peripheral fence 180F, loss of the edge of the cell insulating layer 160 and the upper insulating layer 170 on the edge of the cell insulating layer 160 may be suppressed due to pattern density of the cell extension portions 160E. Accordingly, forming the cell conductive lines 200 may be facilitated.

Accordingly, it is possible to minimize the defects in the manufacturing process and to provide a semiconductor device that is easy to be manufactured and a method of manufacturing the same.

According to some implementations, the cell insulating layer covering the data storage patterns on the cell region includes the cell extending portions protruding on the peripheral region. The cell extending portions may vertically overlap the reference conductive lines on the peripheral region, respectively. In this case, the reference conductive lines on the peripheral region may be protected by the cell extending portions during the etching process for the forming of the peripheral opening, thereby preventing the upper portions of the reference conductive lines from being recessed during the etching process. As a result, the defects in the reference conductive lines may be minimized. In addition, after the peripheral insulating layer filling the peripheral opening is formed, the planarization process may be performed on the peripheral insulating layer to remove peripheral fences remaining on the cell extending portions and on the edges of the cell insulating layer. In this case, during the planarization process the, loss of the cell insulating layer at the boundary between the cell region and the peripheral region may be suppressed due to the pattern density of the cell extending portions. Accordingly, the cell conductive lines may be easily formed in the cell insulating layer.

Accordingly, it is possible to minimize the defects in the manufacturing process and to provide the semiconductor device that is easy to be manufactured and a method of manufacturing the same.

While this disclosure contains many specific implementation details, these should not be construed as limitations on the scope of what may be claimed. Certain features that are described in this disclosure in the context of separate implementations can also be implemented in combination in a single implementation. Conversely, various features that are described in the context of a single implementation can also be implemented in multiple implementations separately or in any suitable subcombination. Moreover, although features may be described above as acting in certain combinations and even initially be claimed as such, one or more features from a combination can in some cases be excised from the combination, and the combination may be directed to a subcombination or variation of a subcombination While implementations are described above, a person skilled in the art would understand that many modifications and variations are available without departing from the spirit and scope of the present disclosure defined in the following claims. Accordingly, the example implementations of the present disclosure should be considered in all respects as illustrative and not restrictive, with the spirit and scope of the present disclosure being indicated by the appended claims.

What is claimed is:

1. A semiconductor device comprising:
- a substrate defining a cell region and a peripheral region;
- a wiring structure disposed in the cell region and the peripheral region;
- a lower insulating layer disposed on the wiring structure on the cell region and extending above the wiring structure on the peripheral region;
- a plurality of data storage patterns disposed on the lower insulating layer on the cell region;
- a cell insulating layer disposed on the lower insulating layer on the cell region and covering the plurality of data storage patterns, the cell insulating layer including a plurality of cell extending portions, wherein the plurality of cell extending portions extend above the lower insulating layer on the peripheral region in a first direction that is parallel to an upper surface of the substrate, and wherein the plurality of cell extending portions are spaced apart from each other in a second direction that is parallel to the upper surface of the substrate and intersects the first direction; and
- a peripheral insulating layer disposed on the lower insulating layer on the peripheral region and including a material different from the cell insulating layer,
- wherein the peripheral insulating layer extends between the plurality of cell extending portions and contacts a side surface of the cell insulating layer.

2. The semiconductor device of claim 1, wherein the peripheral insulating layer includes an insulating material having a lower dielectric constant than the cell insulating layer.

3. The semiconductor device of claim 1,
- wherein the wiring structure includes a plurality of reference conductive lines extending in the first direction on the cell region and spaced apart from each other in the second direction,
- wherein the plurality of reference conductive lines extend above the peripheral region in the first direction, and wherein the plurality of cell extending portions respectively extend above the plurality of reference conductive lines on the peripheral region in the first direction.

4. The semiconductor device of claim 3, wherein the plurality of cell extending portions vertically and respectively overlap the plurality of reference conductive lines in a third direction perpendicular to the upper surface of the substrate.

5. The semiconductor device of claim 3, further comprising a plurality of lower electrode contacts penetrating the lower insulating layer on the cell region and respectively connected to the plurality of data storage patterns, wherein the wiring structure further includes a plurality of lower conductive lines disposed on the cell region, and wherein each of the plurality of lower electrode contacts is connected to a corresponding lower conductive line among the plurality of lower conductive lines.

6. The semiconductor device of claim 5, wherein the plurality of reference conductive lines and the plurality of lower conductive lines are positioned at a same height from the substrate.

7. The semiconductor device of claim 5, wherein the wiring structure further includes a plurality of wiring lines disposed between the plurality of reference conductive lines and the substrate and between the plurality of lower conductive lines and the substrate, wherein each of the plurality of lower conductive lines is electrically connected to a corresponding wiring line among the plurality of wiring lines, and wherein each of the plurality of reference conductive lines is electrically connected to a corresponding wiring line among the plurality of wiring lines.

8. The semiconductor device of claim 1, wherein the lower insulating layer on the cell region has a recessed upper surface that is recessed toward the substrate between the plurality of data storage patterns, and wherein an upper surface of the lower insulating layer on the peripheral region is positioned at a height lower than the recessed upper surface of the lower insulating layer on the cell region.

9. The semiconductor device of claim 8, further comprising a capping insulating layer disposed between each side surface of the plurality of data storage patterns and the cell insulating layer and extending between the recessed upper surface of the lower insulating layer and the cell insulating layer, and wherein the capping insulating layer extends between each of the plurality of cell extending portions and the lower insulating layer on the peripheral region.

10. The semiconductor device of claim 1, further comprising an upper insulating layer disposed on the cell insulating layer and extending above the plurality of cell extending portions, wherein the peripheral insulating layer contacts a side surface of the upper insulating layer.

11. The semiconductor device of claim 10, wherein the peripheral insulating layer includes an insulating material having a lower dielectric constant than the cell insulating layer and the upper insulating layer.

12. A semiconductor device comprising:

a substrate defining a cell region and a peripheral region;

a wiring structure disposed on the cell region and the peripheral region, wherein the wiring structure includes a reference conductive line extending in a first direction parallel to an upper surface of the substrate on the cell region, and wherein the reference conductive line extends above the peripheral region in the first direction;

a lower insulating layer disposed on the wiring structure on the cell region and extending above the wiring structure in the peripheral region;

a plurality of data storage patterns disposed on the lower insulating layer on the cell region;

a cell insulating layer disposed on the lower insulating layer on the cell region and covering the plurality of data storage patterns, wherein the cell insulating layer includes a cell extending portion extending above the lower insulating layer on the peripheral region in the first direction, and wherein the cell extending portion vertically overlaps the reference conductive line on the peripheral region in a direction perpendicular to the upper surface of the substrate; and a peripheral insulating layer disposed on the lower insulating layer on the peripheral region and including a material different from that of the cell insulating layer, wherein the peripheral insulating layer is in contact with a side surface of the cell extending portion.

13. The semiconductor device of claim 12, wherein the peripheral insulating layer includes an insulating material having a lower dielectric constant than the cell insulating layer.

14. The semiconductor device of claim 12, wherein the wiring structure further includes a plurality of wiring lines disposed between the substrate and the reference conductive line, and wherein the reference conductive line is electrically connected to a corresponding wiring line among the plurality of wiring lines.

15. The semiconductor device of claim 14, wherein the reference conductive line is electrically separated from the plurality of data storage patterns by the lower insulating layer.

16. The semiconductor device of claim 12, wherein each of the plurality of data storage patterns includes a lower electrode, a magnetic tunnel junction pattern, and an upper electrode sequentially stacked on the lower insulating layer.

17. The semiconductor device of claim 16, further comprising a plurality of lower electrode contacts penetrating the lower insulating layer on the cell region and respectively connected to the data storage patterns, wherein the wiring structure further includes a plurality of lower conductive lines disposed on the cell region, and wherein each of the plurality of lower electrode contacts is connected to a corresponding lower conductive line among the plurality of lower conductive lines.

18. The semiconductor device of claim 12, further comprising an upper insulating layer disposed on the cell insulating layer and extending above the cell extending portion, wherein the peripheral insulating layer contacts a side surface of the upper insulating layer.

19. The semiconductor device of claim 18, wherein the peripheral insulating layer includes an insulating material having a lower dielectric constant than the cell insulating layer and the upper insulating layer.

20. The semiconductor device of claim 12, further comprising a capping insulating layer disposed between each side surface of the plurality of data storage patterns and the cell insulating layer and extending between an upper surface of the lower insulating layer on the cell region and the cell insulating layer, wherein the capping insulating layer extends between the cell extending portion and the lower insulating layer on the peripheral region.

* * * * *